(12) United States Patent
Parthasarathy et al.

(10) Patent No.: US 9,831,666 B2
(45) Date of Patent: Nov. 28, 2017

(54) APPARATUS AND METHODS FOR ELECTROSTATIC DISCHARGE PROTECTION OF RADIO FREQUENCY INTERFACES

(71) Applicant: ANALOG DEVICES, INC., Norwood, MA (US)

(72) Inventors: Srivatsan Parthasarathy, Acton, MA (US); Javier Alejandro Salcedo, North Billerica, MA (US); Rodrigo Carrillo-Ramirez, Chelmsford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 118 days.

(21) Appl. No.: 14/797,770

(22) Filed: Jul. 13, 2015

(65) Prior Publication Data

US 2016/0336740 A1      Nov. 17, 2016

Related U.S. Application Data

(60) Provisional application No. 62/162,225, filed on May 15, 2015.

(51) Int. Cl.
*H02H 9/04* (2006.01)
*H01L 27/02* (2006.01)

(52) U.S. Cl.
CPC ......... *H02H 9/046* (2013.01); *H01L 27/0248* (2013.01); *H02H 9/04* (2013.01)

(58) Field of Classification Search
USPC ......................................................... 361/56
See application file for complete search history.

(56) References Cited

U.S. PATENT DOCUMENTS

| | | |
|---|---|---|
| 3,407,339 A | 10/1968 | Booher |
| 5,311,391 A | 5/1994 | Dungan et al. |
| 5,644,459 A | 7/1997 | Lien |
| 7,164,567 B2 | 1/2007 | Litwin et al. |
| 7,450,358 B2 | 11/2008 | Gossner et al. |
| 8,199,447 B2 | 6/2012 | Gee et al. |
| 8,283,698 B2 | 10/2012 | Sorgeloos et al. |
| 8,350,329 B2 | 1/2013 | Campi et al. |

(Continued)

*Primary Examiner* — Dharti Patel
(74) *Attorney, Agent, or Firm* — Knobbe, Martens, Olson & Bear, LLP

(57) ABSTRACT

Apparatus and methods for electrostatic discharge (ESD) protection of radio frequency circuits are provided. In certain configurations, an integrated circuit includes a first pin, a second pin, a forward ESD protection circuit, and a reverse ESD protection circuit. The forward ESD protection circuit includes one or more P+/N-EPI diodes, one or more ESD protection devices, and one or more P-EPI/N+ diodes electrically connected in series between the first pin and the second pin. A first P+/N-EPI diode of the one or more P+/N-EPI diodes includes an anode electrically connected to the first pin. The reverse ESD protection circuit comprising one or more P+/N-EPI diodes, one or more ESD protection devices, and one or more P-EPI/N+ diodes electrically connected in series between the second pin and the first pin. A first P-EPI/N+ diode of the one or more P-EPI/N+ diodes includes a cathode electrically connected to the first pin.

35 Claims, 15 Drawing Sheets

(56) References Cited

U.S. PATENT DOCUMENTS

| | | |
|---|---|---|
| 9,019,669 B1 * | 4/2015 | Ransijn .................... H02H 9/04 |
| | | 361/56 |
| 2005/0083618 A1 | 4/2005 | Steinhoff et al. |
| 2009/0086394 A1 | 4/2009 | Yasuda et al. |
| 2013/0279051 A1 | 10/2013 | Gill et al. |
| 2014/0049862 A1 | 2/2014 | Ma et al. |
| 2014/0240877 A1 | 8/2014 | Reinprecht |
| 2016/0336744 A1 | 11/2016 | Parthasarathy et al. |

* cited by examiner

APPARATUS AND METHODS FOR ELECTROSTATIC DISCHARGE PROTECTION OF RADIO FREQUENCY INTERFACES

CROSS-REFERENCE TO RELATED APPLICATIONS

The present application claims priority to U.S. Provisional Patent Application No. 62/162,225, filed May 15, 2015, titled "APPARATUS AND METHODS FOR ELECTROSTATIC DISCHARGE PROTECTION OF RADIO FREQUENCY CIRCUITS," the entirety of which is hereby incorporated herein by reference. This application is related to U.S. application Ser. No. 14/797,675, entitled "ELECTROSTATIC DISCHARGE PROTECTION CIRCUITS FOR RADIO FREQUENCY COMMUNICATION SYSTEMS" (Inventors: Srivatsan Parthasarathy, Javier Alejandro Salcedo, and Rodrigo Carrillo-Ramirez; filed on even date herewith), the disclosure of which is incorporated herein by reference in its entirety.

BACKGROUND

Field

Embodiments of the invention relate to electronic systems, and more particularly, to radio frequency electrostatic discharge protection (ESD) circuits.

Description of the Related Technology

Radio frequency systems can be exposed to an electrostatic discharge (ESD) event, or an electrical signal of a relatively short duration having rapidly changing voltage and high power.

ESD events can damage integrated circuits (ICs) inside an electronic system due to overvoltage conditions and/or high levels of power dissipation over relatively small areas of the ICs. High power dissipation can increase IC temperature, and can lead to numerous problems, such as gate oxide punch-through, junction damage, metal damage, and surface charge accumulation. Moreover, ESD events can induce latch-up (in other words, inadvertent creation of a low-impedance path), thereby disrupting the functioning of the IC and potentially causing permanent damage to the IC. Thus, there is a need to provide an IC with protection from such ESD events, such as during IC power-up and power-down conditions.

SUMMARY

In one aspect, an integrated circuit includes a first pin, a second pin, and an electrostatic discharge (ESD) protection circuit including two or more pairs of field-effect transistors (FETs) electrically connected in series between the first pin and the second pin. Each of the two or more pairs of FETs includes a negative ESD protection FET including a source and a gate electrically connected to one another and a drain, and a positive ESD protection FET including a source and a gate electrically connected to one another and a drain. The drain of the negative ESD protection FET is electrically connected to the drain of the positive ESD protection FET.

In another aspect, an apparatus is provided. The apparatus includes a first pin, a second pin, and an ESD protection circuit electrically connected between the first pin and the second pin. The ESD protection circuit includes a first negative ESD protection FET including a source and a gate electrically connected to the first pin, a first positive ESD protection FET including a source and a gate electrically connected to a first intermediate node and a drain electrically connected to a drain of the first negative ESD protection FET, a second negative ESD protection FET including a source and a gate electrically connected to the first intermediate node, and a second positive ESD protection FET including a source and a gate electrically connected to one another and a drain electrically connected to a drain of the second negative ESD protection FET.

In another aspect, a method of ESD protection of an integrated circuit is provided. The method includes receiving a radio frequency signal on a first pin and providing ESD protection to the first pin using two or more pairs of FETs electrically connected in series between the first pin and a second pin. The two or more pairs FETs each include a positive ESD protection FET and a negative ESD protection FET. A source and a gate of the positive ESD protection FET are electrically connected to one another, a source and a gate of the negative ESD protection FET are electrically connected to one another, and a drain of the positive ESD protection FET is electrically connected to a drain of the negative ESD protection FET. The method further includes inhibiting a variation in an overall capacitance of the ESD protection circuit in response to a change of voltage of the first pin by forward-biasing a first portion of a plurality of p-n junctions of the two or more pairs of FETs and by reverse-biasing a second portion of the plurality of p-n junctions.

In another aspect, an integrated circuit is provided. The integrated circuit includes a first pin, a second pin, a substrate, and an ESD protection circuit over the substrate. The ESD protection circuit includes a forward ESD protection circuit configured to provide protection against a positive polarity ESD event received between the first pin and the second pin. The forward ESD protection circuit includes a first diode of a first type having an anode electrically connected to the first pin. The ESD protection circuit further includes a reverse ESD protection circuit configured to provide protection against a negative polarity ESD event received between the first pin and the second pin. The reverse ESD protection circuit comprises a first diode of a second type having a cathode electrically connected to the first pin. A capacitance between the substrate and the anode of the first diode of the first type is less than a capacitance between the substrate and a cathode of the first diode of the first type, and a capacitance between the substrate and the cathode of the first diode of the second type is less than a capacitance between the substrate and an anode of the first diode of the second type.

In another aspect, a method of ESD protection is provided. The method includes protecting a first pin of an integrated circuit from a positive polarity ESD event using a forward ESD protection circuit, protecting the first pin from a negative polarity ESD event using a reverse ESD protection circuit, and isolating the first pin from a capacitance of the forward ESD protection circuit to a substrate of the integrated circuit using a first diode of a first type, and isolating the first pin from a capacitance of the reverse ESD protection circuit to the substrate using a first diode of a second type. The first diode of the first type has an anode electrically connected to the first pin, and a capacitance between the substrate and the anode of the first diode of the first type is less than a capacitance between the substrate and a cathode of the first diode of the first type. Additionally, the first diode of the second type has a cathode electrically connected to the first pin, and a capacitance between the substrate and the cathode of the first diode of the second type is less than a capacitance between the substrate and an anode of the first diode of the second type.

In another aspect, an integrated circuit is provided. The integrated circuit includes a first pin, a second pin, a forward ESD protection circuit, and a reverse ESD protection circuit. The forward ESD protection circuit includes one or more P+/N-EPI diodes, one or more ESD protection devices, and one or more P-EPI/N+ diodes electrically connected in series between the first pin and the second pin. A first P+/N-EPI diode of the one or more P+/N-EPI diodes includes an anode electrically connected to the first pin. The reverse ESD protection circuit includes one or more P+/N-EPI diodes, one or more ESD protection devices, and one or more P-EPI/N+ diodes electrically connected in series between the second pin and the first pin. A first P-EPI/N+ diode of the one or more P-EPI/N+ diodes includes a cathode electrically connected to the first pin.

In another aspect, an integrated circuit is provided. The integrated circuit includes a high frequency signal pin, a ground pin, a plurality of ESD protection circuits, and one or more inductors configured to isolate the high frequency signal pin from at least a portion of a capacitance of the plurality of ESD protection circuits. The plurality of ESD protection circuits comprising a first ESD protection circuit and a second ESD protection circuit, wherein the plurality of ESD protection circuits are configured to activate to provide an electrical path between the high frequency signal pin and the ground pin in response to an ESD event. The one or more inductors includes a first inductor electrically connected between the first ESD protection circuit and the second ESD protection circuit.

In another aspect, an ESD protection network for providing ESD protection between a high frequency signal pin and a ground pin is provided. The ESD protection network includes a first ESD protection circuit including a first terminal electrically connected to the high frequency signal pin and a second terminal electrically connected to the ground pin, a first inductor including a first end electrically connected to the first terminal of the first ESD protection circuit and a second end, and a second ESD protection circuit including a first terminal electrically connected to the second end of the first inductor and a second terminal electrically connected to the ground pin. The first inductor is configured to isolate the high frequency signal pin from a capacitance of the second ESD protection circuit.

In another aspect, a method of providing ESD protection is provided. The method includes receiving a signal on a high frequency signal pin, providing ESD protection to the high frequency signal pin using a plurality of ESD protection circuits comprising a first ESD protection circuit and a second ESD protection circuit, and isolating the high frequency signal pin from at least a portion of a capacitance of the plurality of ESD protection circuits using one or more inductors. Isolating the high frequency signal pin includes isolating a capacitance of the second ESD protection circuit from the high frequency signal using a first inductor of the one or more inductors. The first inductor is electrically connected between the first ESD protection circuit and the second ESD protection circuit.

DETAILED DESCRIPTION OF EMBODIMENTS

Figure 1:
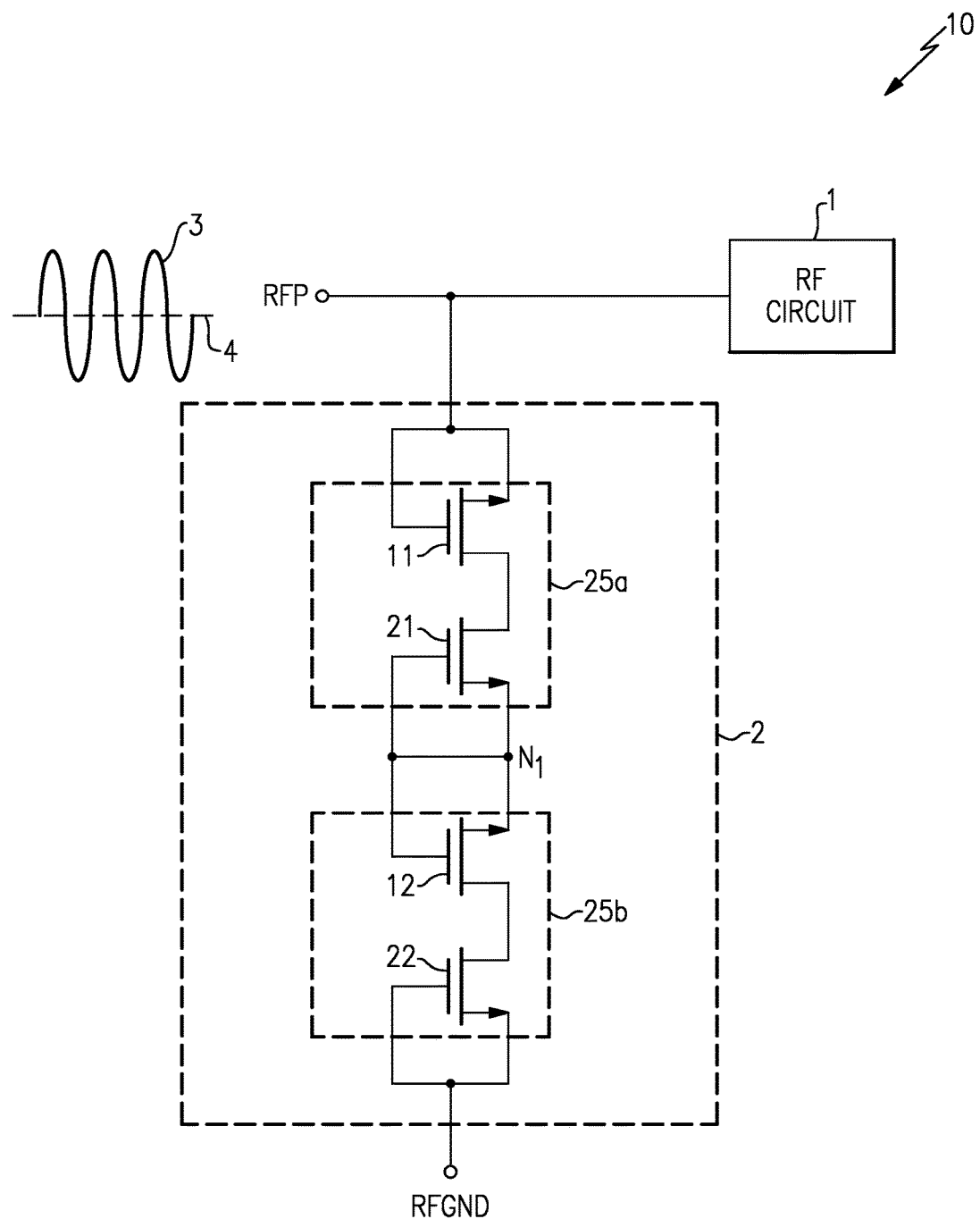
FIG. 1 is a circuit diagram of a radio frequency integrated circuit (IC) including an electrostatic discharge (ESD) protection circuit according to one embodiment.

The following detailed description of embodiments presents various descriptions of specific embodiments of the invention. However, the invention can be embodied in a multitude of different ways as defined and covered by the claims. In this description, reference is made to the drawings in which like reference numerals indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

To help assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the International Organization for Standardization (ISO). The standards can cover a wide multitude of electrostatic discharge (ESD) events. To meet such standards, an integrated circuit can include ESD protection circuits.

Absent a protection scheme, a radio frequency system can be damaged from ESD events. Although an ESD protection circuit can be connected to a radio frequency signal pin of the radio frequency system to provide ESD protection, the ESD protection circuit can undesirably load the radio frequency signal pin. The load can adversely impact several important radio frequency characteristics, including, for example, S-parameters of the radio frequency system, such as return loss (S11) and/or return gain (S12).

For example, an ESD protection circuit has a capacitance, which loads the radio frequency signal pin with an impedance that changes with frequency. Not only is the magnitude of the ESD protection circuit's capacitance important, but also a change of the circuit's capacitance with respect to a voltage across the ESD protection circuit. For instance, an ESD protection circuit that has a capacitance that changes with voltage can degrade the linearity of a radio frequency system, such as degrading the system's third-order intermodulation (IM3) and/or third-order intercept point (IP3). Additionally, return loss can vary with capacitance, and thus both overall capacitance of an ESD protection circuit and a change of the ESD protection circuit's capacitance versus frequency can impact return loss.

The inventors have recognized that an ESD protection circuit exhibits a highly linear capacitance versus voltage characteristic when components of the ESD protection circuit are arranged such that diffusion and depletion capacitances cancel each other in response to voltage changes. A forward-biased p-n junction has a diffusion capacitance associated with excess carriers in the p-n junction's neutral region, while a reverse-biased p-n junction has a depletion capacitance associated with charge variation in the p-n junction's depletion region. Since diffusion capacitance increases with voltage and depletion capacitance decreases with voltage, a series combination of a forward-biased junction and a reverse-biased junction can have an overall capacitance that is relatively constant in response to changes in voltage. For example, at a given bias voltage, a first portion of the bias voltage can be across the forward-biased junction and corresponding diffusion capacitance and a second portion of the bias voltage can be across the reverse-biased junction and corresponding depletion capacitance.

In certain configurations herein, a radio frequency integrated circuit (IC) includes an ESD protection circuit including multiple field-effect transistors (FETs) electrically connected in series between a radio frequency signal pin and a radio frequency ground pin. The FETs include source-to-body p-n junctions and drain-to-body p-n junctions. During normal operation of the radio frequency IC when an ESD event is not present, a radio frequency signal can be received on the radio frequency signal pin and a voltage across the ESD protection circuit can change over time.

The ESD protection circuit is configured such that over a normal operating voltage range of the radio frequency signal pin, a first portion of the FETs' p-n junctions are forward-biased and operate as diffusion capacitances and a second portion of the FETs' p-n junctions are reverse-biased and operate as depletion capacitances. The forward-biased and reverse-biased p-n junctions are electrically connected in series between the radio frequency signal pin and the radio frequency signal pin, and a change to the voltage across the ESD protection circuit results in voltages across the p-n junctions changing. Although the individual capacitances of the p-n junctions change with the voltage across the ESD protection circuit, the overall capacitance of the combination of forward-biased junctions and reverse-biased junctions remains relatively constant. Thus, even when the voltage of the radio frequency signal pin changes with time (for example, across a radio frequency signal cycle) the ESD protection circuit exhibits a relatively small variation in overall capacitance.

For example, even when a depletion capacitance increases in response to a change of signal pin voltage, a corresponding diffusion capacitance can decrease such that the overall capacitance of the ESD protection circuit is about the same. Thus, the ESD protection circuit can exhibit a substantially flat capacitance versus voltage characteristic over a range of voltage operation of the radio frequency signal pin. The constancy in the ESD protection circuit's capacitance results in the radio frequency IC exhibiting superior performance, including high linearity.

Apparatus and methods for ESD protection of radio frequency circuits are provided. In certain configurations, a radio frequency system includes a radio frequency signal pin, a radio frequency ground pin, and an ESD protection circuit electrically connected between the radio frequency signal pin and the radio frequency ground pin. The ESD protection circuit includes a series combination of two or more pairs of field effect transistors (FETs) with the same device polarity electrically between the radio frequency signal pin and the radio frequency ground pin. Each pair of FETs includes a negative ESD protection FET for providing protection against negative polarity ESD events and a positive ESD protection FET for providing protection against positive polarity ESD events. The source and gate of the negative ESD protection FET are connected to one another, and the source and gate of the positive ESD protection FET are connected to one another. Additionally, the drain of the negative ESD protection FET is connected to the drain of the positive ESD protection FET.

FIG. 1 is a circuit diagram of a radio frequency integrated circuit (IC) 10 including an electrostatic discharge (ESD) protection circuit according to one embodiment. The radio frequency IC 10 includes a radio frequency signal pin RFP, a radio frequency ground pin RFGND, a radio frequency circuit 1, and an ESD protection circuit 2. The radio frequency circuit 1 is electrically connected to the radio frequency signal pin RFP, and the ESD protection circuit 2 is electrically connected between the radio frequency signal pin RFP and the radio frequency ground pin RFGND.

Although only certain circuitry associated with an interface of the radio frequency IC 10 is shown, the radio frequency IC 10 typically includes additional circuitry.

Additionally, the radio frequency IC 10 can include additional pins and other structures. Such details are omitted from FIG. 1 for clarity.

The radio frequency circuit 1 can correspond to a wide variety of radio frequency circuitry. In one embodiment, the radio frequency circuit 1 comprises a radio frequency switch, such as a silicon on insulator (SOI) switch. In another embodiment, the radio frequency circuit includes at least one of a filter, an amplifier (for example, a low noise amplifier), a resonator, a tuner, a mixer or an attenuator.

The radio frequency signal pin RFP corresponds to a signal pin, including, for example, a pad, a port, a lead, and/or other structure used by the radio frequency IC 10 to communicate with external circuitry. The radio frequency ground pin RFGND corresponds to a radio frequency ground of the radio frequency IC 10. The radio frequency ground pin RFGND can be implemented in a variety of ways, and can correspond to a pad, a port, a lead, a die paddle, a through-substrate via, and/or other structure used for providing ground to the radio frequency IC 10.

The ESD protection circuit 2 includes a first pair of FETs 25*a* including a first negative ESD protection FET 11 and a first positive ESD protection FET 21. Additionally, the ESD protection circuit 2 further includes a second pair of FETs 25*b* including a second negative ESD protection FET 12 and a second positive ESD protection FET 22.

In the illustrated configuration, the first and second negative ESD protection FETs 11, 12 are both n-type FETs, such as n-type metal oxide semiconductor (NMOS) transistors. Additionally, the first and second positive ESD protection FETs 21, 22 are both n-type FETs, such as NMOS transistors. Thus, the negative ESD protection FETs 11, 12 and the positive ESD protection FETs 21, 22 are of the same type of device polarity, which is n-type in this embodiment.

As shown in FIG. 1, a source and a gate of the first negative ESD protection FET 11 are electrically connected to one another and to the radio frequency signal pin RFP. Additionally, a drain of the first negative ESD protection FET 11 is electrically connected to a drain of the first positive ESD protection FET 21. Furthermore, a source and a gate of the first positive ESD protection FET 21 are electrically connected to a source and a drain of the second negative ESD protection FET 12 at a first intermediate node $N_1$. Additionally, a drain of the second negative ESD protection FET 12 is electrically connected to a drain of the second positive ESD protection FET 22. Furthermore, a source and a gate of the second positive ESD protection FET 22 are electrically connected to one another and to the radio frequency ground pin RFGND.

The illustrated ESD protection circuit 2 operates bidirectionally to protect the radio frequency circuit 1 against both positive polarity ESD events that increase the voltage of the radio frequency signal pin RFP relative to the voltage of the radio frequency ground pin RFGND and negative polarity ESD events that decrease the voltage of the radio frequency signal pin RFP relative to the voltage of the radio frequency ground pin RFGND.

When the voltage of the radio frequency signal pin RFP increases relative to the voltage of the radio frequency ground pin RFGND, the first and second negative ESD protection FETs 11, 12 operate as diode-connected FETs that turn on in response to a relatively small forward voltage. However, the first and second positive ESD protection FETs 21, 22 provide forward voltage blocking and maintain the ESD protection circuit 2 turned off in the presence of positive voltages within the normal input voltage range of the radio frequency signal pin RFP. However, when the voltage of the radio frequency signal pin RFP reaches a forward trigger voltage during a positive polarity ESD event, the first and second positive ESD protection FETs 21, 22 activate to provide a low impedance path from the radio frequency signal pin RFP to the radio frequency ground pin RFGND to provide ESD protection. The first and second positive ESD protection FETs 21, 22 can activate in response to a positive polarity ESD event based on a variety of triggering mechanisms, such as avalanche breakdown.

When the voltage of the radio frequency signal pin RFP decreases relative to the voltage of the radio frequency ground pin RFGND, the first and second positive ESD protection FETs 21, 22 operate as diode-connected FETs that turn on in response to a relatively small reverse voltage. However, the first and second negative ESD protection FETs 11, 12 provide reverse voltage blocking and maintain the ESD protection circuit 2 turned off in the presence of negative voltages within the normal input voltage range. However, when the voltage of the radio frequency signal pin RFP reaches a reverse trigger voltage during a negative polarity ESD event, the first and second negative ESD protection FETs 11, 12 activate to provide a low impedance path from the radio frequency signal pin RFP to the radio frequency ground pin RFGND to provide ESD protection. The first and second reverse ESD protection FETs 11, 12 can activate in response to a negative polarity ESD event based on a variety of triggering mechanisms, such as avalanche breakdown.

Accordingly, the ESD protection circuit 2 operates bidirectionally, and a forward protection characteristic of the ESD protection circuit 2 is based on the first and second positive ESD protection FETs 21, 22 and a reverse protection characteristic is based on the first and second negative ESD protection FETs 11, 12.

Although the ESD protection circuit 2 illustrates an embodiment including two pairs of FETs 25*a*, 25*b*, the ESD protection circuit 2 can be modified to include additional FET pairs achieve a desired protection characteristic. For example, including additional FET pairs in the series can increase the ESD protection circuit's forward and reverse trigger voltages, thereby providing a protection characteristic suitable for a particular signal swing on the radio frequency signal pin RFP. In one embodiment, an ESD protection circuit includes between 2 and 10 pairs of FETs each including a negative ESD protection FET and a positive ESD protection FET.

The ESD protection circuit 2 provides a relatively low capacitance and flat capacitance versus voltage characteristic. For example, junction capacitances of the FETs shown in FIG. 1 are in series with one another, which aids in decreasing overall capacitance. Thus, the magnitude of the ESD protection circuit's capacitance can be relatively small.

Additionally, the ESD protection circuit 2 is implemented using a configuration of FETs that is symmetric with response to positive and negative signal voltages, which reduces variation of capacitance versus voltage across the ESD protection circuit 2. For example, the radio frequency signal pin RFP can receive a radio frequency signal 3 that swings above and below a voltage 4 of the radio frequency ground pin RFGND. In conventional radio frequency ESD protection circuits, voltage variation associated with radio frequency signal swing can change the ESD protection circuit's capacitance, which can degrade linearity.

In contrast, the illustrated ESD protection circuit 2 is implemented using FETs that are electrically connected symmetrically with respect to the radio frequency signal pin RFP and the radio frequency ground pin RFGND. Thus, a capacitive loading provided by the ESD protection circuit 2 can be about equal at corresponding positive and negative voltage levels (for instance, at +1 V and at −1 V). Configuring the ESD protection circuit 2 using a symmetric FET configuration aids in providing a flat capacitance versus voltage characteristic.

Furthermore, the illustrated configuration is implemented in a manner that each pair of FETs 25a, 25b includes a mix of depletion capacitance and diffusion capacitance both when the voltage of the radio frequency signal pin RFP is positive and when the voltage of the radio frequency signal pin RFP is negative. Since diffusion capacitance increases with voltage and depletion capacitance decreases with voltage, a series combination of a forward-biased junction and a reverse-biased junction can have an overall capacitance that is relatively constant in response to changes in voltage. Thus, even when a radio frequency signal 3 is present and swings above and below the voltage 4 of the radio frequency ground pin RFGND, each pair of FETs 25a, 25b includes a mix of p-n junctions that are forward-biased and that are reverse-biased.

Thus, at a given voltage on the radio frequency signal pin RFP, a first portion of the signal pin voltage can be across forward-biased junctions (diffusion capacitances) and a second portion of the bias voltage can be across reverse-biased junctions (depletion capacitances). Since diffusion capacitance increases with voltage and depletion capacitance decreases with voltage, a series combination of forward-biased junctions and reverse-biased junctions can have an overall capacitance that is relatively linear in response to changes in voltage.

Accordingly, the ESD protection circuit 2 can exhibit a substantially flat capacitance versus voltage characteristic over a range of voltage operation of the radio frequency signal pin RFP. Thus, the ESD protection circuit 2 provides ESD protection while having a relatively small impact on the IC's radio frequency performance.

Figure 2:
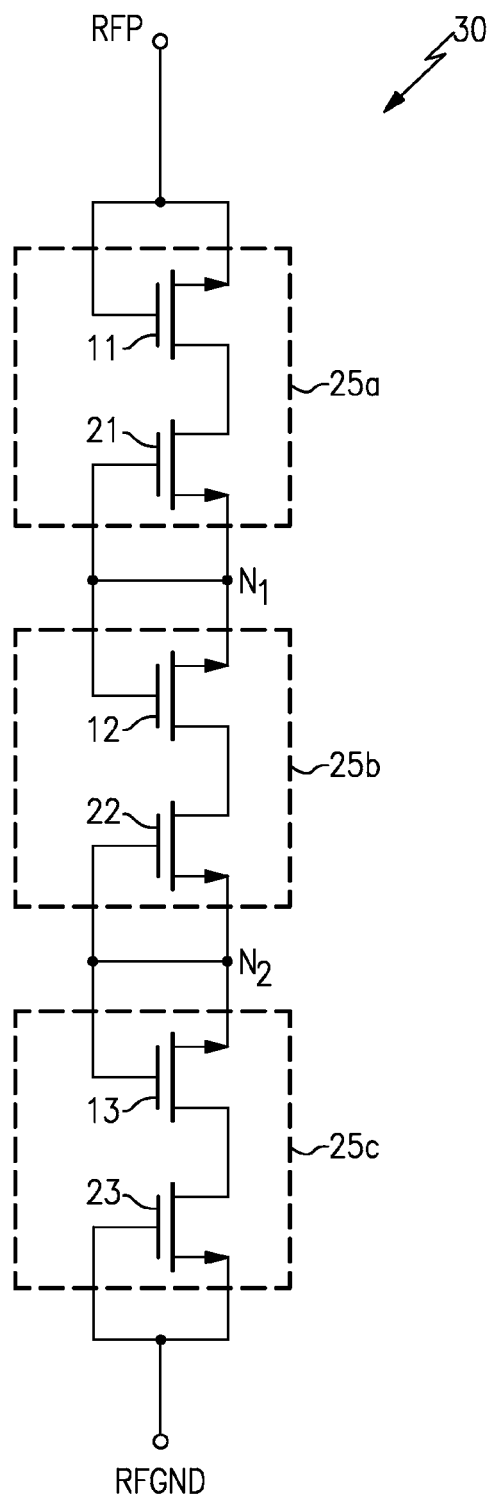
FIG. 2 is a circuit diagram of another embodiment of an ESD protection circuit for a radio frequency system.

FIG. 2 is a circuit diagram of another embodiment of an ESD protection circuit for a radio frequency system. The ESD protection circuit 30 includes three pairs of FETs 25a-25c electrically connected in series between a radio frequency signal pin RFP and a radio frequency ground pin RFGND.

The first pair of FETs 25a includes a first negative ESD protection FET 11 and a first positive ESD protection FET 21. The first negative ESD protection FET 11 includes a source and gate electrically connected to the radio frequency signal pin, and a drain electrically connected to a drain of the first positive ESD protection FET 21. Additionally, a source and a gate of the first positive ESD protection FET 21 are electrically connected to a first intermediate node $N_1$. The second pair of FETs 25b includes a second negative ESD protection FET 12 and a second positive ESD protection FET 22. The second negative ESD protection FET 12 includes a source and gate electrically connected to the first intermediate node $N_1$, and a drain electrically connected to a drain of the second positive ESD protection FET 22. Additionally, a source and a gate of the second positive ESD protection FET 22 are electrically connected to a second intermediate node $N_2$. The third pair of FETs 25c includes a third negative ESD protection FET 13 and a third positive ESD protection FET 23. The third negative ESD protection FET 13 includes a source and gate electrically connected to the second intermediate node $N_2$, and a drain electrically connected to a drain of the third positive ESD protection FET 23. Additionally, a source and a gate of the third positive ESD protection FET 23 are electrically connected to the radio frequency ground pin RFGND.

In contrast to the ESD protection circuit 2 of FIG. 1 that includes two pairs of FETs, the ESD protection circuit 30 of FIG. 2 includes three pairs of FETs. One or more additional pairs of FETs can be added to the ESD protection circuit 30 to achieve a desired forward and reverse protection characteristic.

Additional details of the ESD protection circuit 30 can be similar to those described earlier.

Figure 3A:
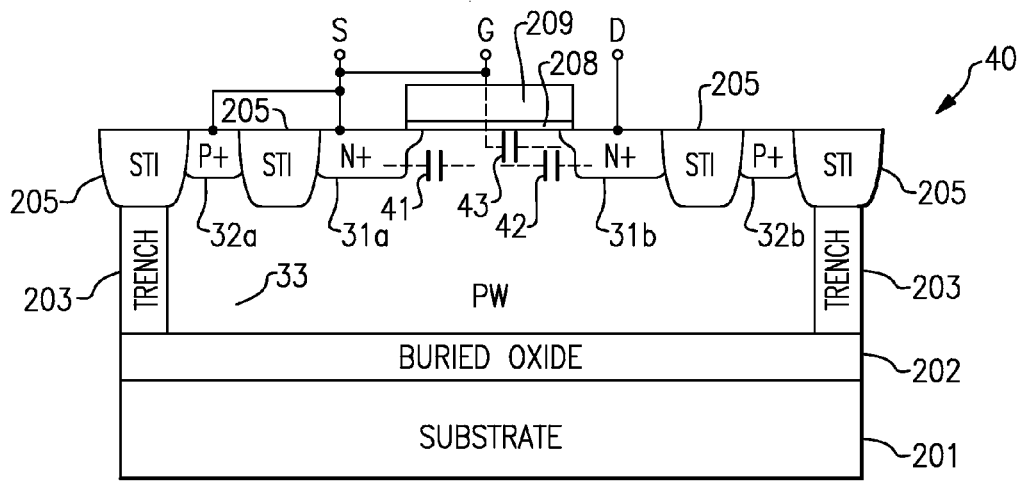
FIG. 3A is an annotated cross-section of an NMOS device according to one embodiment.

FIG. 3A is an annotated cross-section of an n-type metal oxide semiconductor (NMOS) device 40 according to one embodiment. The NMOS device 40 includes a support substrate 201, a buried oxide or insulator layer 202, deep trench isolation regions 203, shallow trench isolation regions 205, a first n-type active (N+) region 31a, a second N+ region 31b, a first p-type active (P+) region 32a, a second P+ region 32b, p-type well (PW) 33, a gate insulator 208, and a gate 209. The NMOS device 40 further includes a gate terminal (G), a source terminal (S), and a drain terminal (D).

The NMOS device 40 is implemented using a silicon on insulator (SOI) process. The support substrate 201 can be implemented using a semiconductor substrate, such as a lightly doped substrate. In certain configurations, the support substrate 201 is controlled to a reference voltage, such as ground, during operation. In other configurations, the support substrate 201 can be electrically floating or uncontrolled by an external voltage. As shown in FIG. 3A, the buried oxide layer 202 is positioned over the support substrate 201. The buried oxide layer 202 can correspond to an electrical insulator, such as silicon dioxide ($SiO_2$). Although the illustrated embodiment uses a buried oxide layer, other configurations are possible, such as configurations using electrical insulators that are not oxides.

As shown in FIG. 3A, the PW 33 is positioned over the buried oxide layer 202. In certain configurations, the PW 33 is formed by implantation of an epitaxial layer that is positioned over the buried oxide layer 202. Additionally, the deep trench isolation regions 203 and the shallow trench isolation regions 205 can be formed by etching the epitaxial layer and filling the trenches with a dielectric, such as silicon dioxide, and removing the excess dielectric using any suitable method, such as chemical-mechanical planarization. Including both deep trench isolation regions 203 and the shallow trench isolation regions 205 can aid in reducing parasitic capacitance of a device by providing lateral decoupling.

The gate insulator 208 is formed over a portion of the PW 33, and the gate 209 is formed over the gate insulator 208. The gate insulator 208 and the gate 209 can be fabricated used a wide variety of materials. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The N+ regions 31a, 31b and P+ regions 32a, 32b can be formed by implantation. The P+ regions 32a, 32b have a higher peak doping concentration that the PW 33. In one embodiment, the P+ regions 32a, 32b and the N+ regions 31a, 31b have a peak doping concentration in the range of about $1 \times 10^{20}$ $cm^{-3}$ to about $8 \times 10^{20}$ $cm^{-3}$, the PW 33 has a peak doping concentration in the range of about $1.5 \times 10^{16}$ $cm^{-3}$ to about $7.5 \times 10^{16}$ $cm^{-3}$, and the carrier substrate 201 has a peak doping concentration in the range of about $1.0 \times 10^{13}$ $cm^{-3}$ to about $5.0 \times 10^{15}$ $cm^{-3}$.

In the illustrated configuration, the first N+ region 31a is positioned in the PW 33 on a first side of the gate 209, and the second N+ region 31b is positioned in the PW 33 on a second side of the gate 209 opposite the first side. The first N+ region 31a servers as a transistor source and the second N+ region 31b serves as a transistor drain. The first and second P+ regions 32a, 32b are positioned in the PW 33, and can be used to control the NMOS device's body voltage.

With reference to FIG. 3A, various electrical connections have been annotated in the illustrated cross-section. For example, the source terminal is electrically connected to first P+ region 32a and the first N+ region 31a. Additionally, the drain terminal is electrically connected to the second N+ region 31b. Furthermore, the gate terminal is electrically connected to the gate 209 and also to the source terminal in this embodiment. The illustrated electrical connections can be made using contacts and metallization during back end processing.

The NMOS device 40 has been annotated to show certain capacitive components of the device's cross-section, including a first or source-to-body junction capacitor 41, a second or drain-to-body junction capacitor 42, and a gate capacitor 43.

The first junction capacitor 41 corresponds to a capacitance of the p-n junction between the first N+ region 31a and the PW 33, and the second junction capacitor 42 corresponds to a capacitance of the p-n junction between the second N+ region 31b and the PW 33. The first and second junction capacitors 41, 42 can be depletion or diffusion capacitances depending on biasing. The gate capacitor 43 corresponds to a capacitance between the gate terminal and the drain terminal. The capacitance of the gate capacitor 43 changes with bias voltages, including back gate bias.

The NMOS device 40 illustrates one embodiment of FETs of FIGS. 1-2. However, the FETs of FIGS. 1-2 can be implemented using other configurations of transistors.

Figure 3B:
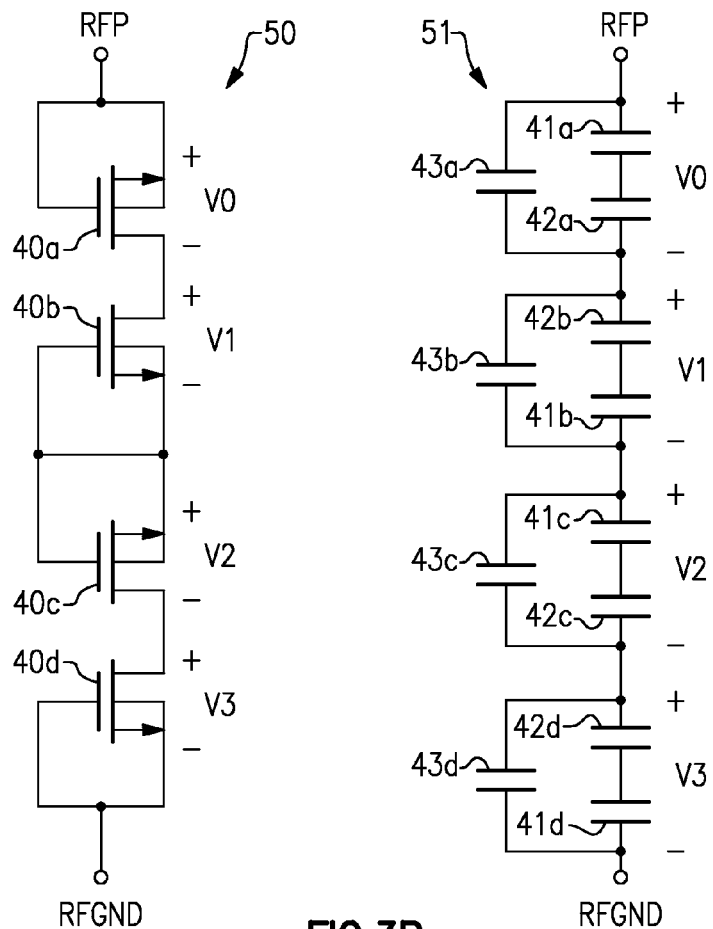
FIG. 3B is a circuit diagram on one embodiment of an ESD protection circuit and a parasitic capacitance model thereof.

FIG. 3B is a circuit diagram on one embodiment of an ESD protection circuit 50 and a parasitic capacitance model 51 thereof.

The ESD protection circuit 50 of FIG. 3B is similar to the ESD protection circuit 2 of FIG. 1, except that the ESD protection circuit 50 includes a specific transistor implementation. In particular, the ESD protection circuit 50 of FIG. 3B includes a first NMOS transistor 40a, a second NMOS transistor 40b, a third NMOS transistor 40c, and a fourth NMOS transistor 40d, which are implemented using the NMOS device 40 of FIG. 3A.

As shown in FIG. 3B, a gate, source and body of the first NMOS transistor 40a are electrically connected to the radio frequency signal pin RFP. Additionally, a drain of the first NMOS transistor 40a is electrically connected to a drain of the second NMOS transistor 40b. Furthermore, a gate, source, and body of the second NMOS transistor 40b are electrically connected to a gate, source, and body of the third NMOS transistor 40c at a common node. Additionally, a drain of the third NMOS transistor 40c is electrically connected to a drain of the fourth NMOS transistor 40d. Furthermore, a gate, source, and body of the fourth NMOS transistor 40d are electrically connected to the radio frequency ground pin RFGND. The first and third NMOS transistors 40a, 40c serve as negative ESD protection FETs, and the second and fourth NMOS transistors 40b, 40d serve as positive ESD protection FETs.

Transistor capacitances of the ESD protection circuit 50 have been modeled in the parasitic capacitance model 51. In particular, capacitance of the first NMOS transistor 40a have been modeled using a first source-to-body junction capacitor 41a (corresponding to the source-to-body junction capacitor 41 of FIG. 3A), a first drain-to-body junction capacitor 42a (corresponding to the drain-to-body junction capacitor 42 of FIG. 3A), and a first gate capacitor 43a (corresponding to the gate capacitor 43 of FIG. 3A). Similarly, capacitances of the second to fourth NMOS transistors 40b-40d have been modeled using second to fourth source-to-body junction capacitors 41b-41d, second to fourth drain-to-body junction capacitors 42b-42d, and second to fourth gate capacitors 43b-43d, respectively.

The ESD protection circuit 50 and the parasitic capacitance model 51 have been annotated to show a bias voltage V0 across the first NMOS transistor 40a, a bias voltage V1 across the second NMOS transistor 40b, a bias voltage V2 across the third NMOS transistor 40c, and a bias voltage V3 across the fourth NMOS transistor 40d. Depending on the voltage difference between the radio frequency signal pin RFP and the radio frequency ground pin RFGND, the polarity and magnitude of the bias voltages V0-V3 can change.

In one example, the voltage difference between the radio frequency signal pin RFP and the radio frequency ground pin RFGND is +3 V, and the corresponding bias voltages V0, V1, V2, and V3 are +0.1 V, +1.4 V, +0.1 V, and +1.4 V, respectively. Although one example of the bias voltages have been provided, other values are possible, such as values that depend on implementation and/or processing.

Depending on the voltage values of the bias voltages V0-V3, the capacitances of the source-to-body junction capacitors 41a-41d, drain-to-body junction capacitors 42a-42d, and gate capacitors 43a-43d can change. The change to the capacitances of the source-to-body junction capacitors 41a-41d and drain-to-body junction capacitors 42a-42d is based on whether the junction is forward or reversed biased as well as on the magnitude of the voltage. Additionally, the change to the capacitance of the gate capacitors 43a-43d can depend on whether or not an inversion layer is present in the transistor as well as on back gate bias effects. For example, when a particular NMOS transistor is under large reverse bias, no inversion layer is present and back gate bias effects can result in an increase threshold voltage and a corresponding decrease in gate capacitance. Accordingly, an NMOS transistor under large reverse bias can have an overall capacitance dominated by junction capacitors. In contrast, an NMOS transistor under forward bias can have an overall capacitance dominated by a gate capacitor.

For example, when the voltage difference between the radio frequency signal pin RFP and the radio frequency ground pin RFGND is positive and the first and third NMOS transistors 40a, 40c are turned on, the capacitance values of the source-to-body junction capacitors 41a, 41c and the drain-to-body junction capacitors 42a, 42c can be small compared to the gate capacitors 43a, 43c. Additionally, when the voltage difference between the radio frequency signal pin RFP and the radio frequency ground pin RFGND is positive and the second and fourth NMOS transistors 40b, 40d are turned off, the capacitance values of the source-to-body junction capacitors 41b, 41d and the drain-to-body junction capacitors 42b, 42d can be large compared to the gate capacitors 43b, 43d.

In one example, the bias voltages V0, V1, V2, and V3 are +0.1 V, +1.4 V, +0.1 V, and +1.4 V, respectively, the overall capacitance of the ESD protection circuit 50 can be approximated by the series combination of the first gate capacitor 43a, the second drain-to-body junction capacitor 42b, the second source-to-body junction capacitor 41b, the third gate capacitor 43c, the fourth drain-to-body junction capacitor 42d, and the fourth source-to-body junction capacitor 41d.

The ESD protection circuit 50 has a capacitance that can load the radio frequency signal pin RFP. However, the ESD protection circuit's capacitance includes capacitive components that are in series with one another, which reduces an overall capacitance. Additionally, the ESD protection circuit 2 can exhibit a highly linear capacitance versus voltage characteristic since the NMOS transistors 40a-40d of the ESD protection circuit are arranged such that depletion and diffusion capacitances cancel each other in response to voltage changes.

For example, when the voltage difference between the radio frequency signal pin RFP and the radio frequency ground pin RFGND is positive, the overall capacitance of the ESD protection circuit 50 can be approximated by the series combination of the first gate capacitor 43a, the second drain-to-body junction capacitor 42b, the second source-to-body junction capacitor 41b, the third gate capacitor 43c, the fourth drain-to-body junction capacitor 42d, and the fourth source-to-body junction capacitor 41d. Under such biasing, the second drain-to-body junction capacitor 42b corresponds to a depletion capacitance, the second source-to-body junction capacitor 41b corresponds to a diffusion capacitance, the fourth drain-to-body junction capacitor 42d corresponds to a depletion capacitance, and the fourth source-to-body junction capacitor 42d corresponds to a diffusion capacitance.

The ESD protection circuit 50 includes a series combination of p-n junctions between the radio frequency signal pin RFP and the radio frequency ground pin RFGND. For both positive and negative signal pin voltages, a first half of the p-n junctions are forward-biased and operate as diffusion capacitances and a second half of the p-n junctions are reverse-biased and operate as depletion capacitances. Thus, an equal number of forward-biased junctions and reverse-biased junctions are provided for positive and negative signal pin voltages, which results in balancing in capacitance variations in response to voltage changes. Since diffusion capacitance increases with voltage and depletion capacitance decreases with voltage, the ESD protection circuit 50 exhibits high linearity in the presence of a radio frequency signal that swings above and below the voltage of the radio frequency ground pin RFGND.

Furthermore, the linearization of the ESD protection circuit 50 can be further enhanced by the presence of a relatively constant gate oxide capacitance in series with the depletion and diffusion capacitances.

Figure 3C:
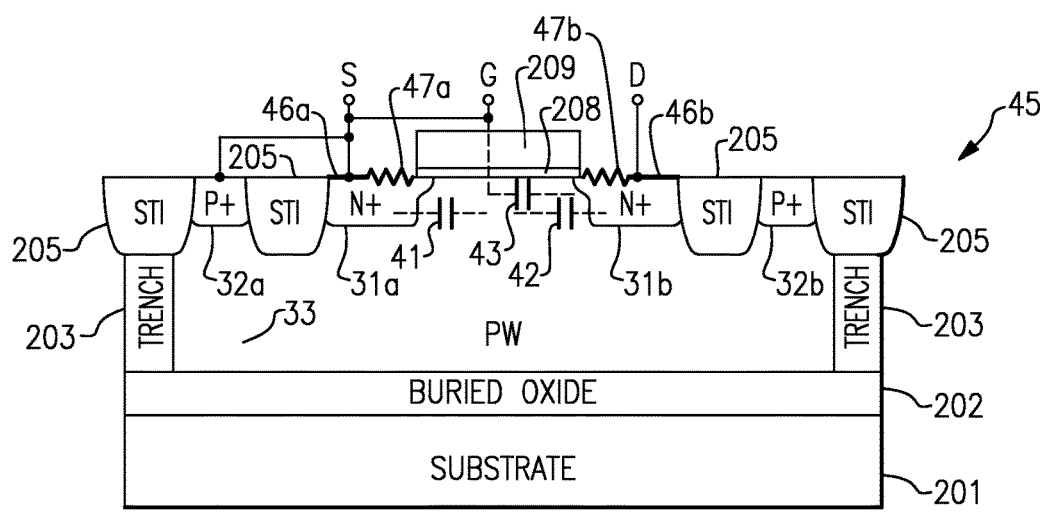
FIG. 3C is an annotated cross-section of an NMOS device according to another embodiment.

FIG. 3C is an annotated cross-section of an NMOS device 45 according to another embodiment. The NMOS device 45 is similar to the NMOS device 40 of FIG. 3A, except that the NMOS device 45 further includes a source-side silicide region 46a, a drain-side silicide region 46b, a source-side ballasting resistor 47a, and a drain-side ballasting resistor 47b.

The source-side ballasting resistor 47a has been provided by blocking silicide over a portion of the N+ region 31a between the source-side silicide region 46a and the gate 209. Similarly, the drain-side ballasting resistor 47b has been provided by blocking silicide over a portion of the N+ region 31b between the drain-side silicide region 46b and the gate 209. In one embodiment, a source-side silicide blocking window and/or a drain-side silicide blocking window has a width in the range of about 0.2 μm to about 2.0 μm, for instance, 1.5 μm.

Including the ballasting resistors 47a, 47b provides higher transient current handling capability. Additional details of the NMOS device 45 can be similar to those described earlier.

Figure 4A:
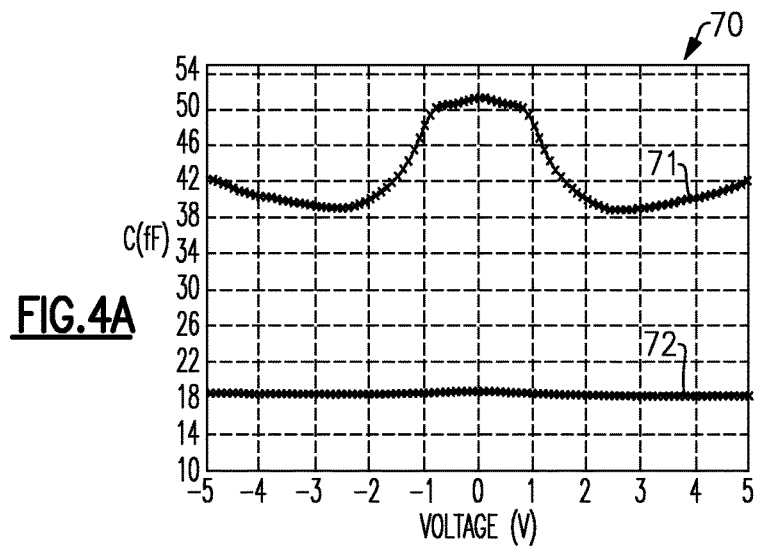
FIG. 4A is a graph of capacitance versus voltage for two examples of ESD protection circuits.

FIG. 4A is a graph 70 of capacitance versus voltage for two examples of ESD protection circuits. The graph 70 corresponds to simulations of capacitance versus DC voltage at 25° C.

The graph 70 includes a first plot 71 of capacitance versus voltage for an ESD protection circuit that includes separate forward and reverse protection subcircuits that are each implemented using a pair of diode-connected NFETs. In particular, the forward and reverse protection subcircuits are electrically connected in parallel with one another between a radio frequency signal pin and a radio frequency ground pin. Additionally, the forward protection subcircuit includes a first pair of diode-connected NFETs electrically connected in series between the radio frequency ground pin and the radio frequency signal pin, and the reverse protection subcircuit includes a second pair of diode-connected NFETs electrically connected in series between the radio frequency signal pin and the radio frequency ground pin.

The graph 70 includes a second plot 72 of capacitance versus voltage for one implementation of the ESD protection circuit 2 of FIG. 1.

As shown in FIG. 4A, the ESD protection circuit of the second plot 72 exhibits a lower overall capacitance than the ESD protection circuit of the first plot 71. Additionally, the ESD protection circuit of the second plot 72 can have a smaller variation in capacitance versus voltage relative to the ESD protection circuit of the first plot 71. For example, the ESD protection circuit of the second plot 72 exhibits a capacitance variation of less than about 1-3 fF over a voltage difference of +/−5V between the radio frequency signal pin RFP and the radio frequency ground pin RFGND.

Figure 4B:
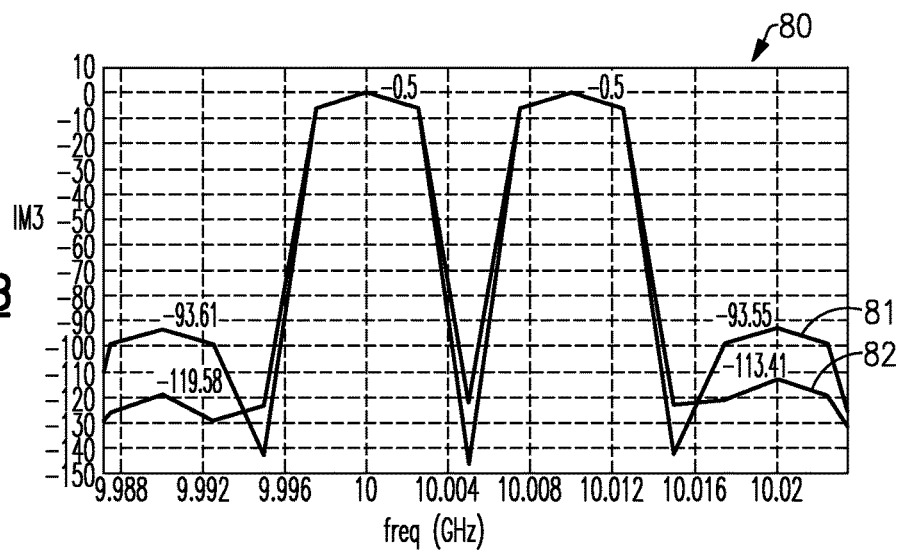
FIG. 4B is a graph of third-order intermodulation (IM3) versus frequency for two examples of ESD protection circuits.

FIG. 4B is a graph 80 of third-order intermodulation (IM3) versus frequency for two examples of ESD protection circuits. The graph 80 corresponds to simulations at 25° C. for a 10 GHz input signal a power of 0 dBm, with the IM3 axis corresponds to output power in dBm.

The graph 80 includes a first plot 81 corresponding to IM3 versus frequency for an ESD protection circuit using separate forward and reverse protection subcircuits each implemented using a pair of diode-connected NFETs as was described earlier with reference to FIG. 4A. The graph 80 further includes a second plot 82 correspond to IM3 versus frequency for one implementation of the ESD protection circuit 2 of FIG. 1.

As shown in FIG. 4B, the ESD protection circuit of the second plot 82 exhibits superior IM3 performance relative to the ESD protection circuit of the first plot 81.

Figure 4C:
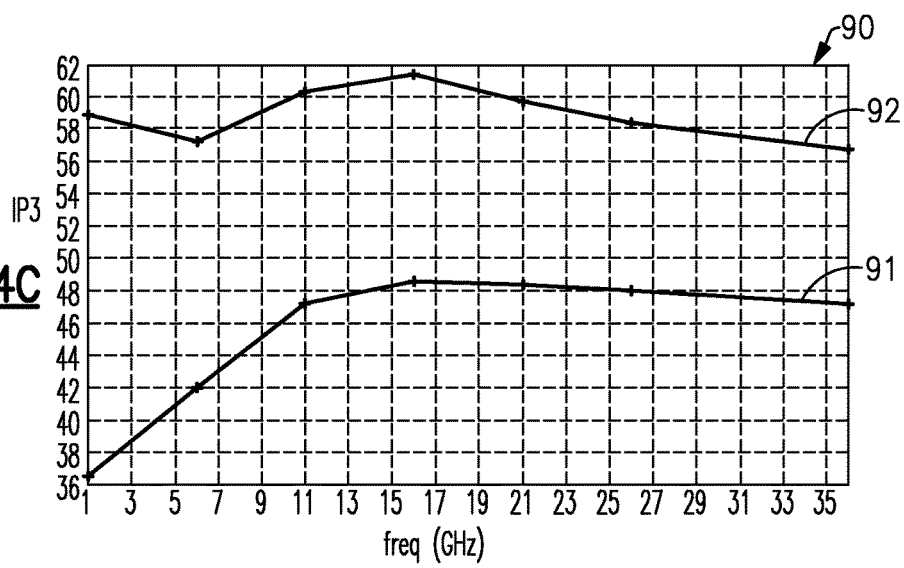
FIG. 4C is a graph of third-order intercept point (IP3) versus frequency for two examples of ESD protection circuits.

FIG. 4C is a graph 90 of third-order intercept point (IP3) versus frequency for two examples of ESD protection circuits. The graph 90 corresponds to simulations of IP3 versus frequency simulations at 25° C. and for 0 dbm power level.

The graph 90 includes a first plot 91 corresponding to IP3 versus frequency for an ESD protection circuit using separate forward and reverse protection subcircuits each implemented using a pair of diode-connected NFETs, as was described earlier with reference to FIG. 4A. The graph 90 further includes a second plot 92 correspond to IP3 versus frequency for one implementation of the ESD protection circuit 2 of FIG. 1.

As shown in FIG. 4C, the ESD protection circuit of the second plot 92 has higher IP3 relative to the ESD protection circuit of the first plot 91.

In certain configurations herein, an ESD protection circuit is implemented using a first type of diode and a second type of diode that have asymmetric substrate capacitance characteristics with respect to the diodes' anodes and cathodes. In particular, the first type of diode is implemented such that the substrate capacitance of the anode is much less than the substrate capacitance of the cathode and the second type of diode is implemented such that the substrate capacitance of the cathode is much less than the substrate capacitance of the anode. The first type of diode can correspond to a P+ region implanted in a lightly doped n-type region, such as an N-EPI layer. Additionally, the second type of diode can correspond to an N+ region implanted in a lightly doped p-type region, such as a P-EPI layer.

The ESD protection circuit protection circuit provides ESD protection to a radio frequency signal pin and is implemented using at least one of the first type of diode and at least one of the second type of diode. Additionally, the diodes are connected to the radio frequency signal pin in a manner that shields or isolates the diodes' substrate capacitances from the radio frequency signal pin. In particular, since the cathode substrate capacitance of the first type of diode is greater than the anode substrate capacitance of the first type of diode, the anode of the first type of diode is electrically connected to the radio frequency signal pin. Additionally, since the anode substrate capacitance of the second type of diode is greater than the cathode substrate capacitance of the second type of diode, the cathode of the second type of diode is electrically connected to the radio frequency signal pin.

In one embodiment, the capacitance between the substrate and the anode of the first type of diode is less than the capacitance between the substrate and the cathode of the first type of diode by at least a factor of 2, and the capacitance between the substrate and the cathode of the second type of diode is less than the capacitance between the substrate and the anode of the second type of diode by at least a factor of 2.

By configuring the ESD protection circuit in this manner, the substrate capacitance of the ESD protection circuit is shielded from the radio frequency signal pin. Substrate capacitance can degrade radio frequency performance such as return loss (S11). Accordingly, configuring the ESD protection circuit in this manner results is a smaller capacitive loading to the radio frequency signal pin and superior performance.

Figure 5:
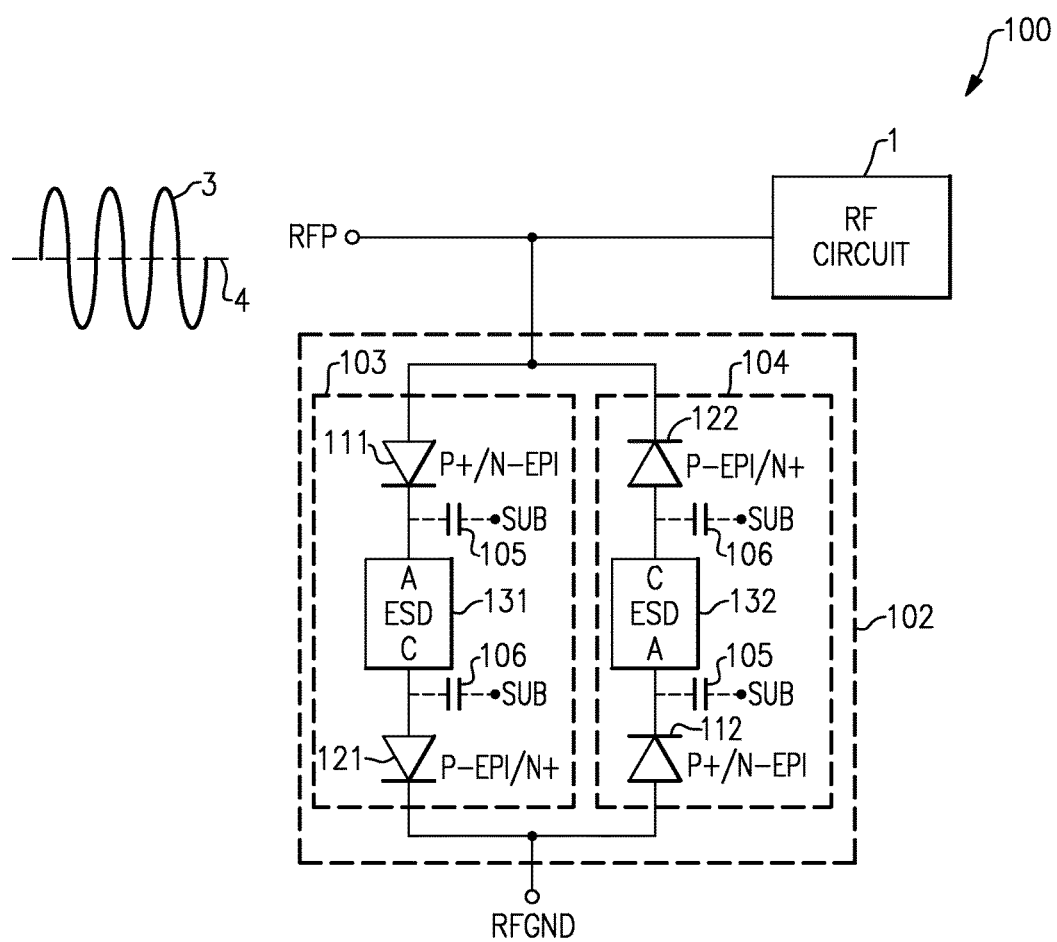
FIG. 5 is a circuit diagram of a radio frequency IC including an ESD protection circuit according to another embodiment.

FIG. 5 is a circuit diagram of a radio frequency IC 100 including an ESD protection circuit according to another embodiment. The IC 100 includes a radio frequency signal pin RFP, a radio frequency ground pin RFGND, and a radio frequency circuit 1, which can be as described earlier. The IC 100 further includes an ESD protection circuit 102 electrically connected between the radio frequency signal pin RFP and the radio frequency ground pin RFGND.

The ESD protection circuit 102 includes a positive or forward ESD protection circuit 103 and a negative or reverse ESD protection circuit 104 electrically connected in parallel between the radio frequency signal pin RFP and the radio frequency ground pin RFGND. The positive ESD protection circuit 103 provides protection against positive polarity ESD events that increase the voltage of the radio frequency signal pin RFP relative to the radio frequency ground pin RFGND. The negative ESD protection circuit 104 provides protection against negative polarity ESD events that decrease the voltage of the radio frequency signal pin RFP relative to the radio frequency ground pin RFGND.

The positive ESD protection circuit 103 includes a P+/N-EPI diode 111, an ESD protection device 131, and a P-EPI/N+ diode 121 electrically connected in series between the radio frequency signal pin RFP and the radio frequency ground pin RFGND. As shown in the FIG. 5, an anode of the P+/N-EPI diode 111 is electrically connected to the radio frequency signal pin RFP, and a cathode of the P+/N-EPI diode 111 is electrically connected to an anode of the ESD protection device 131. Additionally, an anode of the P-EPI/N+ diode 121 is electrically connected to a cathode of the ESD protection device 131, and a cathode of the P-EPI/N+ diode 121 is electrically connected to the radio frequency ground pin RFGND.

The negative ESD protection circuit 104 includes a P+/N-EPI diode 112, an ESD protection device 132, and a P-EPI/N+ diode 122 electrically connected in series between the radio frequency ground pin RFGND and the radio frequency signal pin RFP. As shown in FIG. 5, an anode of the P+/N-EPI diode 112 is electrically connected to the radio frequency ground pin RFGND, and a cathode of the P+/N-EPI diode 112 is electrically connected to an anode of the ESD protection device 132. Additionally, an anode of the P-EPI/N+ diode 122 is electrically connected to a cathode of the ESD protection device 132, and a cathode of the P-EPI/N+ diode 122 is electrically connected to the radio frequency signal pin RFP.

The illustrated ESD protection 102 is implemented using two types of diodes that have different substrate capacitance characteristics. In particular, a parasitic capacitance between a cathode of a P+/N-EPI diode and the substrate is much greater than a parasitic capacitance between an anode of the P+/N-EPI diode and the substrate. Additionally, a parasitic capacitance between an anode of a P-EPI/N+ diode and the substrate is greater than a parasitic capacitance between a cathode of the P-EPI/N+ diode and the substrate. Accordingly, a parasitic substrate capacitance 105 of the P+/N-EPI diodes is predominantly on the cathode while a parasitic substrate capacitance 106 of the P-EPI/N+ diodes is predominantly on the anode.

The ESD protection circuit 102 advantageously shields the radio frequency signal pin RFP from the parasitic substrate capacitances 105, 106 associated with the P+/N-EPI diodes 111, 112 and the P-EPI/N+ diodes 121, 122. Configuring the ESD protection circuit 102 in this manner results is a smaller capacitive loading to the radio frequency signal pin RFP.

Additionally, the ESD protection devices 131, 132 are electrically connected between a P+/N-EPI diode and a P-EPI/N+ diode, which aids in shielding parasitic capacitances of the ESD protection devices 131, 132 from the radio frequency signal pin RFP. The ESD protection devices 131, 132 can be implemented using a variety of ESD protection devices, including, for example, silicon controlled rectifier (SCR) devices, diode devices, bipolar transistor devices, and/or field-effect transistor devices.

Furthermore, junction capacitances of the P+/N-EPI diode 111, the ESD protection device 131, and the P-EPI/N+ diode 121 are electrically connected in series with one another, which provides lower overall capacitive loading of the radio frequency signal pin RFP relative to a configuration including junction capacitances in parallel. Similarly, junction capacitances of the P+/N-EPI diode 112, the ESD protection device 132, and the P-EPI/N+ diode 122 are electrically connected in series with one another to provide low overall capacitive loading to the radio frequency signal pin RFP.

The illustrated ESD protection circuit 102 also includes components electrically connected in a symmetric configuration with respect to the radio frequency signal pin RFP and the radio frequency ground pin RFGND, which aids in providing a relatively flat capacitance versus voltage characteristic, even in the presence of a radio frequency signal 3 that swings above and below a voltage 4 of the radio frequency ground pin RFGND.

Although FIG. 5 illustrates a configuration in which the positive ESD protection circuit 103 includes one P+/N-EPI diode, one ESD protection device, and one P-EPI/N+ diode, the positive ESD protection circuit 103 can be adapted to include additional components, including one or more additional P+/N-EPI diodes, ESD protection devices, and/or P-EPI/N+ diodes. Likewise, the negative ESD protection circuit 104 can be adapted to include additional components, including one or more additional P+/N-EPI diodes, ESD protection devices, and/or P-EPI/N+ diodes.

Although FIG. 5 illustrates a configuration in which the first type of diode is a P+/N-EPI diode and the second type of diode is a P-EPI/N+ diode, the teachings herein are applicable to other configurations of diodes that have an anode and a cathode with asymmetric substrate capacitance properties.

Figure 6:
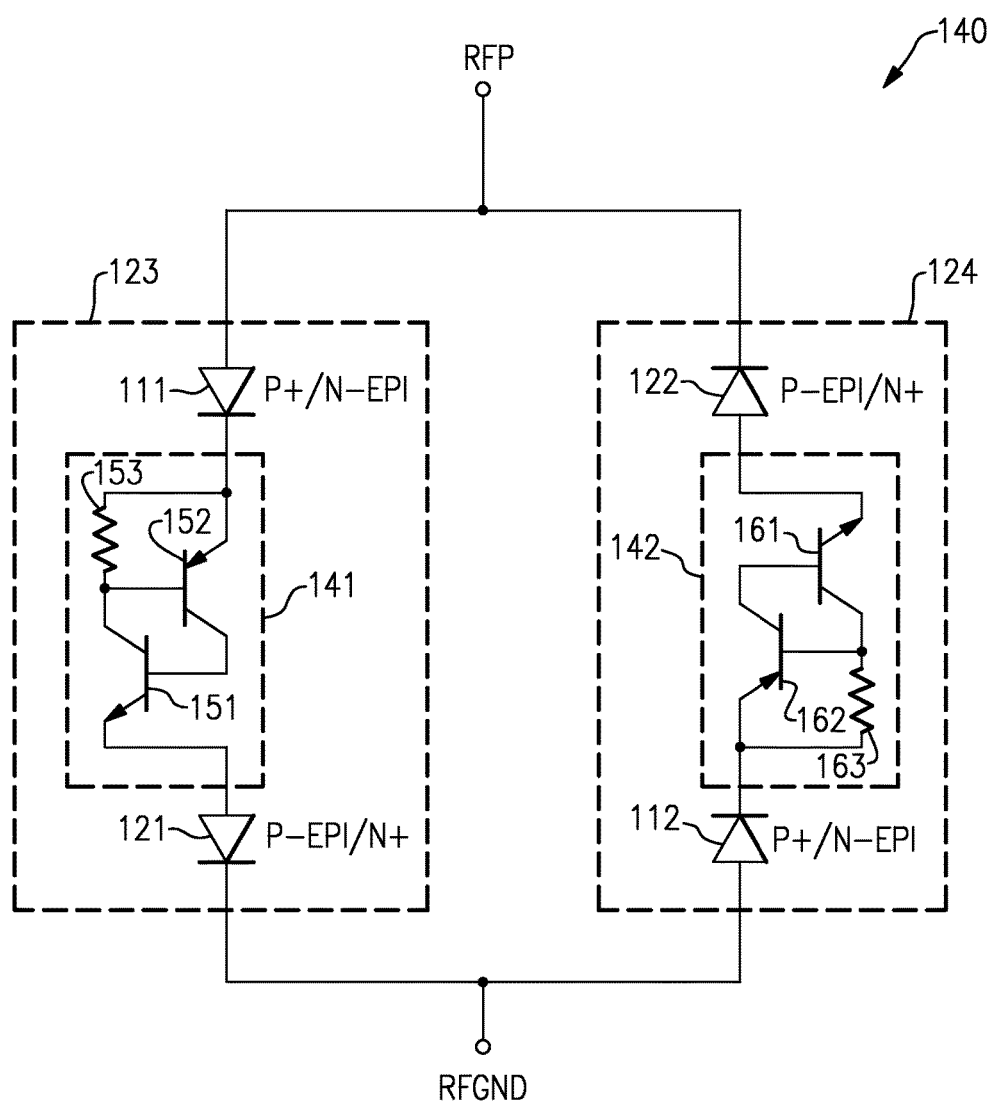
FIG. 6 is a circuit diagram of another embodiment of an ESD protection circuit for a radio frequency system.

FIG. 6 is a circuit diagram of another embodiment of an ESD protection circuit 140 for a radio frequency system. The ESD protection circuit 140 includes a positive ESD protection circuit 123 and a negative ESD protection circuit 124. The ESD protection circuit 140 of FIG. 6 illustrates one implementation of the ESD protection circuit 102 of FIG. 5 in which the ESD protection devices 131, 132 are implemented as SCR devices 141, 142, respectively.

The positive ESD protection circuit 123 includes the P+/N-EPI diode 111, the SCR device 141, and the P-EPI/N+ diode 121 electrically connected in series between the radio frequency signal pin RFP and the radio frequency ground pin RFGND. The SCR device 141 includes an NPN bipolar transistor 151, a PNP bipolar transistor 152, and a resistor 153. The emitter of the NPN bipolar transistor 151 is electrically connected to the anode of the P-EPI/N+ diode 121, the base of the NPN bipolar transistor 151 is electrically connected to the collector of the PNP bipolar transistor 152, and the collector of the NPN bipolar transistor 151 is electrically connected to the base of the PNP bipolar transistor 152. Additionally, the emitter of the PNP bipolar transistor 152 is electrically connected to the cathode of the P+/N-EPI diode 111, and the resistor 153 is electrically connected between the base and emitter of the PNP bipolar transistor 152.

The negative ESD protection circuit 124 includes the P+/N-EPI diode 112, the SCR device 142, and the P-EPI/N+ diode 122 electrically connected in series between the radio frequency ground pin RFGND and the radio frequency signal pin RFP. The SCR device 142 includes an NPN bipolar transistor 161, a PNP bipolar transistor 162, and a resistor 163. The emitter of the NPN bipolar transistor 161 is electrically connected to the anode of the P-EPI/N+ diode 122, the base of the NPN bipolar transistor 161 is electrically connected to the collector of the PNP bipolar transistor 162, and the collector of the NPN bipolar transistor 161 is electrically connected to the base of the PNP bipolar transistor 162. Additionally, the emitter of the PNP bipolar transistor 162 is electrically connected to the cathode of the P+/N-EPI diode 112, and the resistor 163 is electrically connected between the base and emitter of the PNP bipolar transistor 162.

The SCR devices 141, 142 of FIG. 6 illustrate one implementation of the ESD protection devices 131, 132 of FIG. 5. However, the ESD protection devices 131, 132 can be implemented in a wide variety of ways.

Additional details of the ESD protection device 140 can be similar to those described earlier.

Figure 7:
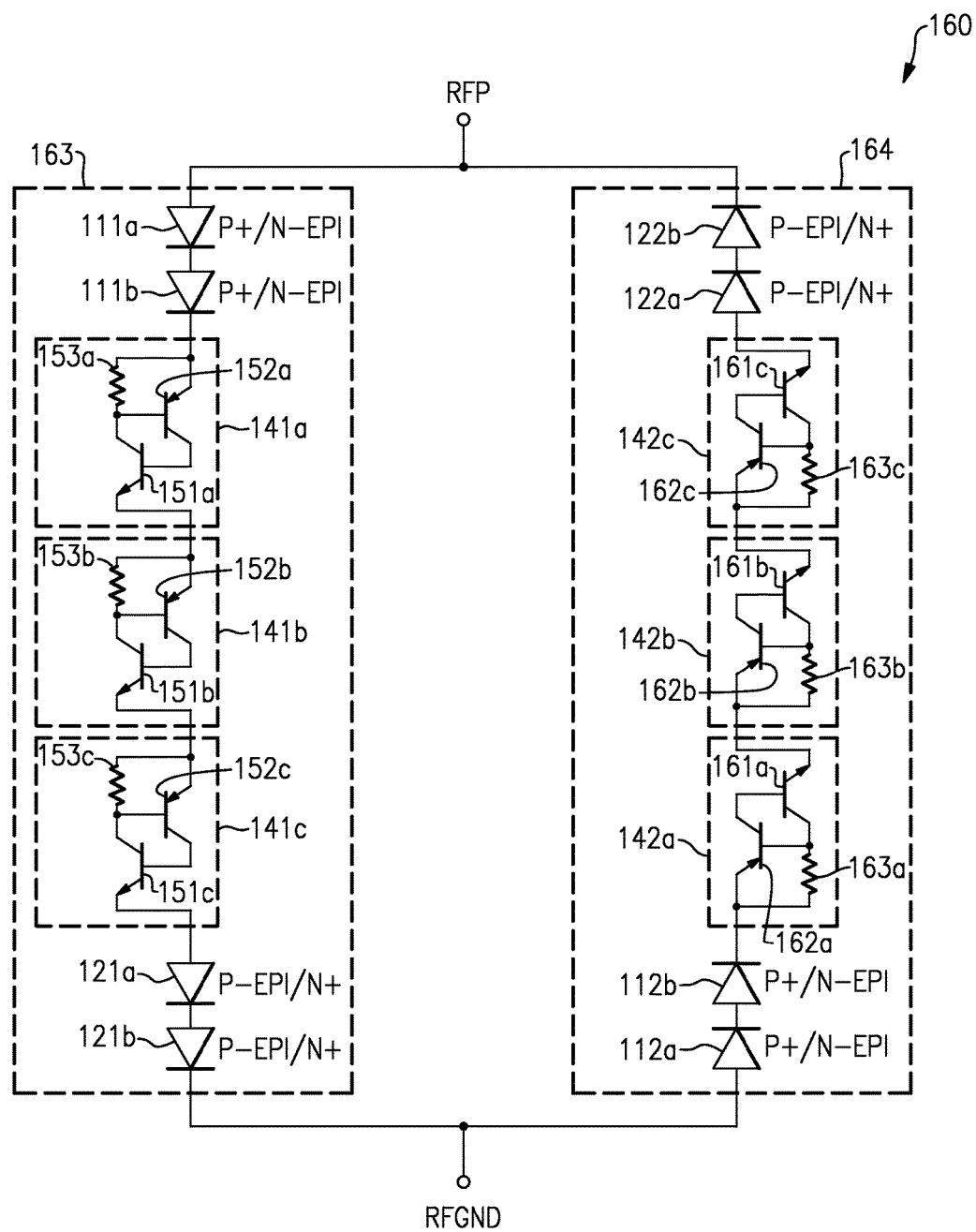
FIG. 7 is a circuit diagram of another embodiment of an ESD protection circuit for a high voltage-tolerant radio frequency system.

FIG. 7 is a circuit diagram of another embodiment of an ESD protection circuit 160 for a high voltage-tolerant radio frequency system. The ESD protection circuit 160 includes a positive ESD protection circuit 163 and a negative ESD protection circuit 164.

As shown in FIG. 7, the positive ESD protection circuit 163 includes a first P+/N-EPI diode 111a, a second P+/N-EPI diode 111b, a first SCR device 141a, a second SCR device 141b, a third SCR device 141c, a first P-EPI/N+ diode 121a, and a second P-EPI/N+ diode 121b electrically connected in series between the radio frequency signal pin RFP and the radio frequency ground pin RFGND. Additionally, the negative ESD protection circuit 164 includes a first P+/N-EPI diode 112a, a second P+/N-EPI diode 112b, a first SCR device 142a, a second SCR device 142b, a third SCR device 142c, a first P-EPI/N+ diode 122a, and a second P-EPI/N+ diode 122b electrically connected in series between the radio frequency ground pin RFGND and the radio frequency signal pin RFP.

Accordingly the illustrated positive and negative ESD protection circuits 163, 164 each include a series combination of two P+/N-EPI diodes, three SCR devices, and two P-EPI/N+ diodes. However, other numbers of P+/N-EPI diodes, P-EPI/N+ diodes, and/or SCR or other ESD protection devices can be selected to achieve a desired bidirectional ESD protection characteristic for a particular radio frequency application. In one embodiment, a positive and a negative ESD protection circuit each include between 1 and 4 P+/N-EPI diodes and between 1 and 4 P+/N-EPI diodes. In one embodiment, a positive and a negative ESD protection circuit each include between 1 and 10 SCR devices or other ESD protection devices electrically connected in series between the P+/N-EPI and P-EPI/N+ diodes.

Additional details of the ESD protection circuit 160 can be similar to those described earlier.

Figure 8A:
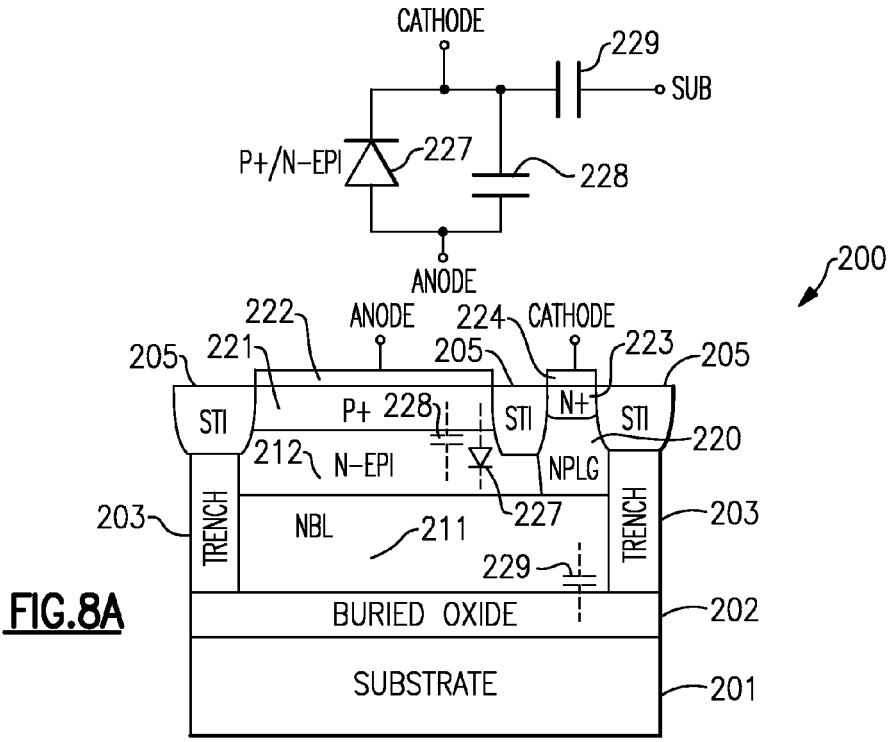
FIG. 8A is an annotated cross-section of a P+/N-EPI diode device according to one embodiment.

FIG. 8A is an annotated cross-section of a P+/N-EPI diode device 200 according to one embodiment. The P+/N-EPI diode device 200 includes a support substrate 201, a buried oxide layer 202, deep trench isolation regions 203, shallow trench isolation regions 205, an n-type buried layer (NBL) 211, an n-type epitaxial (N-EPI) layer 212, an n-type plug (NPLG) region 220, a P+ region 221, an N+ region 223, an anode contact 222, and a cathode contact 224. The P+/N-EPI diode device 200 further includes an anode terminal (ANODE) and a cathode terminal (CATHODE).

The N-EPI layer 212 is positioned over the buried oxide layer 202. The NBL 211 is positioned between the N-EPI layer 212 and the buried oxide layer 202, and in certain implementations is formed by implanting a lower portion of the N-EPI layer 212. The NPLG region 220 is formed in the N-EPI layer 212, and the N+ region 223 is formed in NPLG region 220. The P+ region 221 is formed in the N-EPI layer 212, and STI 205 is formed between the P+ region 221 and the N+ region 224. The anode contact 222 is formed over the P+ region 221 and serves as the anode terminal. Additionally, the cathode contact 224 is formed over the N+ region 223 and serves as the cathode terminal.

The P+ and N+ regions have a higher peak doping concentration than the NPLG region 220. Additionally, the NPLG region 220 has a higher doping concentration than that N-EPI layer 212. Furthermore, the NBL 211 has a higher doping concentration than that N-EPI layer 212. In one embodiment, the P+ and N+ regions have a peak doping concentration in the range of about $1 \times 10^{20}$ cm$^{-3}$ to about $8 \times 10^{20}$ cm$^{-3}$, the NPLG has a peak doping concentration in the range of about $10^{19}$ cm$^{-3}$ to about $10^{20}$ cm$^{-3}$, the NBL has a peak doping concentration in the range of about $10^{18}$ cm$^{-3}$ to about $10^{19}$ cm$^{-3}$, and the N-EPI layer has a peak doping concentration in the range of about $10^{14}$ cm$^{-3}$ to about $10^{15}$ cm$^{-3}$.

The P+/N-EPI diode device 200 has been annotated to show certain circuit components of the device's cross-section, including a P+/N-EPI diode 227, a junction capacitance 228, and a substrate capacitance 229. The junction capacitance 228 and the P+/N-EPI diode 227 are electrically connected in parallel between the device's anode and cathode terminals. Additionally, the substrate capacitance 229 includes a first end electrically connected to the device's cathode terminal and a second end electrically connected to the substrate 201.

The P+/N-EPI diode device 200 illustrates one embodiment of the P+/N-EPI diodes shown in FIGS. 5-7. The cathode of the P+/N-EPI diode device 200 has a much greater capacitance to the substrate 201 relative to the anode of the P+/N-EPI diode device 200. The ESD protection circuits herein advantageously couple the anode of a P+/N-EPI diode to a radio frequency signal pin to avoid loading the radio frequency signal pin with a large parasitic capacitance to the substrate.

As described above, the P+/N-EPI diode device 200 includes the N-EPI layer 212, which has a relatively low n-type concentration that can correspond to a background doping concentration in certain implementations.

Implementing a diode based on a p-n junction between the P+ region 221 and the N-EPI layer 212 can provide very low capacitance similar to that of a PIN diode. Although such a P+/N-EPI diode can have a large series on-state resistance at low current levels, the inventors have realized than during high current ESD events the N-EPI layer 212 is flooded with carriers that drastically reduce the N-EPI layer's resistance. Thus, under high current conditions associated with ESD events, the diode can operate with conductivity modulation and a corresponding lower on-state resistance. Accordingly, a P+/N-EPI diode can advantageously provide low parasitic capacitance and low on-state resistance to ESD events via conductivity modulation.

The P+/N-EPI diode device 200 has a forward recovery, which occurs when the P+/N-EPI diode device 200 is rapidly switched from an OFF state to an ON state. During a relatively fast ESD event, the N-EPI layer 212 can initially have a relatively low conductivity, which can result in a large forward build-up and a corresponding voltage overshoot. As injected charge floods the N-EPI layer 212, the device's conductivity is modulated and the voltage across the P+/N-EPI diode device 200 reduces to a steady-state value.

The overshoot associated with using the N-EPI layer 212 in the P+/N-EPI diode device 200 can be reduced by including the NPLG region 220 to contact the N-EPI layer 212 and/or NBL 211. The NPLG region 220 extends relatively deep and exhibits relatively high lateral diffusion relative to a well implant. The lateral diffusion of the NPLG region 220 beneath the STI 205 results in a shorter electrical path between the anode terminal and the cathode terminal, thereby reducing OFF state resistance and voltage overshoot.

Additional details of the P+/N-EPI diode device 200 can be similar to those described earlier.

Figure 8B:
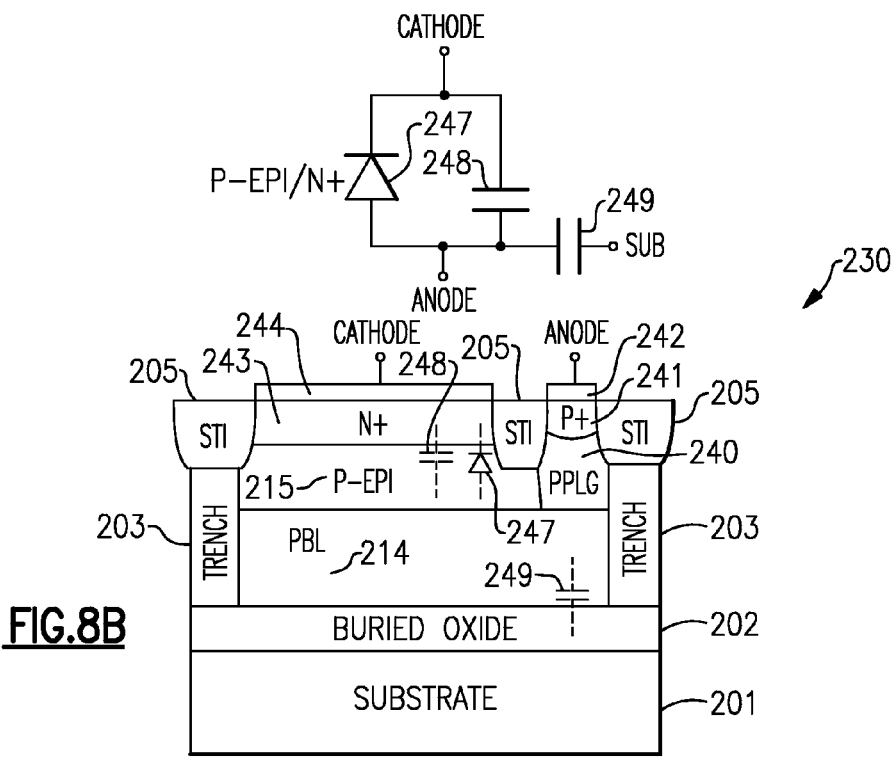
FIG. 8B is an annotated cross-section of a P-EPI/N+ diode device according to one embodiment.

FIG. 8B is an annotated cross-section of a P-EPI/N+ diode device 230 according to one embodiment. The P-EPI/N+ diode device 230 includes a support substrate 201, a buried oxide layer 202, deep trench isolation regions 203, shallow trench isolation regions 205, a p-type buried layer (PBL) 214, a p-type epitaxial (P-EPI) layer 215, an p-type plug (PPLG) region 240, a P+ region 241, an N+ region 243, an anode contact 242, and a cathode contact 244. The P-EPI/N+ diode device 230 further includes an anode terminal (ANODE) and a cathode terminal (CATHODE).

The P-EPI layer 215 is positioned over the buried oxide layer 202. The PBL 214 is positioned between the P-EPI layer 215 and the buried oxide layer 202, and in certain implementations is formed by implanting a lower portion of the P-EPI layer 215. The PPLG region 240 is formed in the P-EPI layer 212, and the P+ region 241 is formed in PPLG region 240. The N+ region 243 is formed in the P-EPI layer 215, and STI 205 is formed between the N+ region 243 and the P+ region 241. The anode contact 242 is formed over the P+ region 241 and serves as the anode terminal. Additionally, the cathode contact 244 is formed over the N+ region 243 and serves as the cathode terminal.

The P+ and N+ regions have a higher peak doping concentration than the PPLG region 240. Additionally, the PPLG region 240 has a higher doping concentration than that P-EPI layer 215. Furthermore, the PBL 214 has a higher doping concentration than that P-EPI layer 215. In one embodiment, the P+ and N+ regions have a peak doping concentration in the range of about $1 \times 10^{20}$ cm$^{-3}$ to about $8 \times 10^{20}$ cm$^{-3}$, the PPLG has a peak doping concentration in the range of about $10^{19}$ cm$^{-3}$ to about $10^{20}$ cm$^{-3}$, the PBL has a peak doping concentration in the range of about $10^{18}$ cm$^{-3}$ to about $10^{19}$ cm$^{-3}$, and the P-EPI layer has a peak doping concentration in the range of about $10^{14}$ cm$^{-3}$ to about $10^{15}$ cm$^{-3}$.

The P-EPI/N+ diode device 230 has been annotated to show certain circuit components of the device's cross-section, including a P-EPI/N+ diode 247, a junction capacitance 248, and a substrate capacitance 249. The junction capacitance 248 and the P-EPI/N+ diode 247 are electrically connected in parallel between the device's anode and cathode terminals. Additionally, the substrate capacitance 249 includes a first end electrically connected to the device's anode terminal and a second end electrically connected to the substrate 201.

The P-EPI/N+ diode device 230 illustrates one embodiment of the P-EPI/N+ diodes shown in FIGS. 5-7. The anode of the P-EPI/N+ diode device 230 has a much greater capacitance to the substrate 201 relative to the cathode of the P-EPI/N+ diode device 230. The ESD protection circuits herein advantageously couple the cathode of a P-EPI/N+ diode to a radio frequency signal pin to avoid loading the radio frequency signal pin with a large parasitic capacitance to the substrate.

The illustrated P-EPI/N+ diode device 230 includes the P-EPI layer 215, which has a relatively low p-type concentration that can correspond to a background doping concentration in certain implementations.

Implementing a diode based on a p-n junction between the P-EPI layer 215 and the N+ region 243 can provide very low capacitance similar to that of a PIN diode. Although such a P-EPI/N+ diode can have a large series on-state resistance at low current levels, the inventors have realized than during high current ESD events the P-EPI layer 215 is flooded with carriers that drastically reduce the P-EPI layer's resistance via conductive modulation. Accordingly, a P-EPI/N+ diode can advantageously provide the benefits of both low parasitic capacitance and low on-state resistance at high current levels associated with ESD events.

Additional details of the P-EPI/N+ diode device 230 can be similar to those described earlier.

Figure 9A:
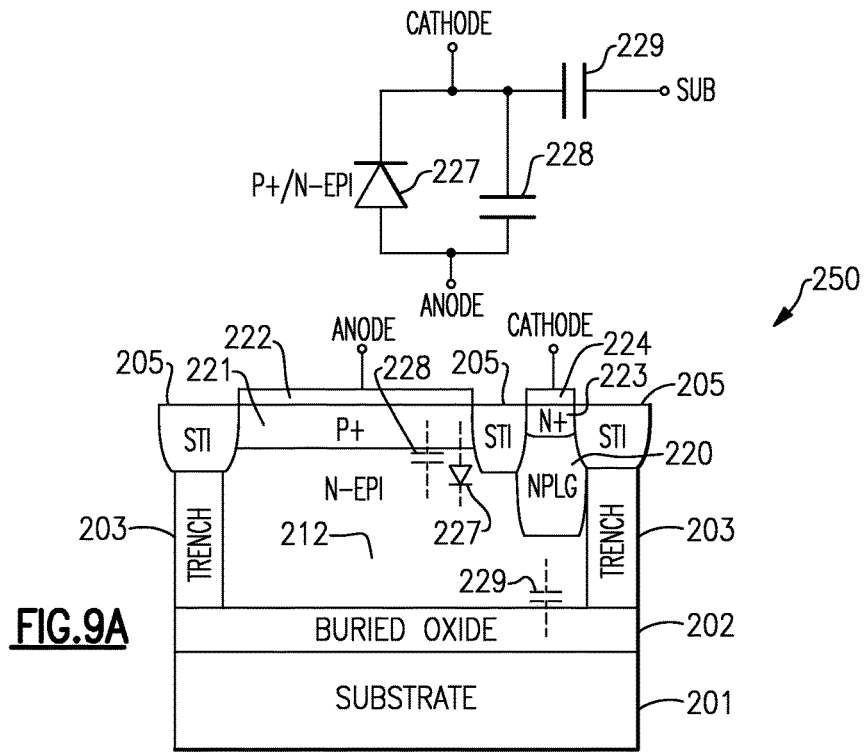
FIG. 9A is an annotated cross-section of a P+/N-EPI diode device according to another embodiment.

FIG. 9A is an annotated cross-section of a P+/N-EPI diode device 250 according to another embodiment. The P+/N-EPI diode device 250 of FIG. 9A is similar to the P+/N-EPI diode device 200 of FIG. 8A, except that the P+/N-EPI diode device 250 omits the NBL 211 of FIG. 8A. Omitting the NBL 211 can reduce a capacitance value of the substrate capacitor 228 and increase the device's breakdown voltage.

Additional details of the P+/N-EPI diode device 250 can be similar to those described earlier.

Figure 9B:
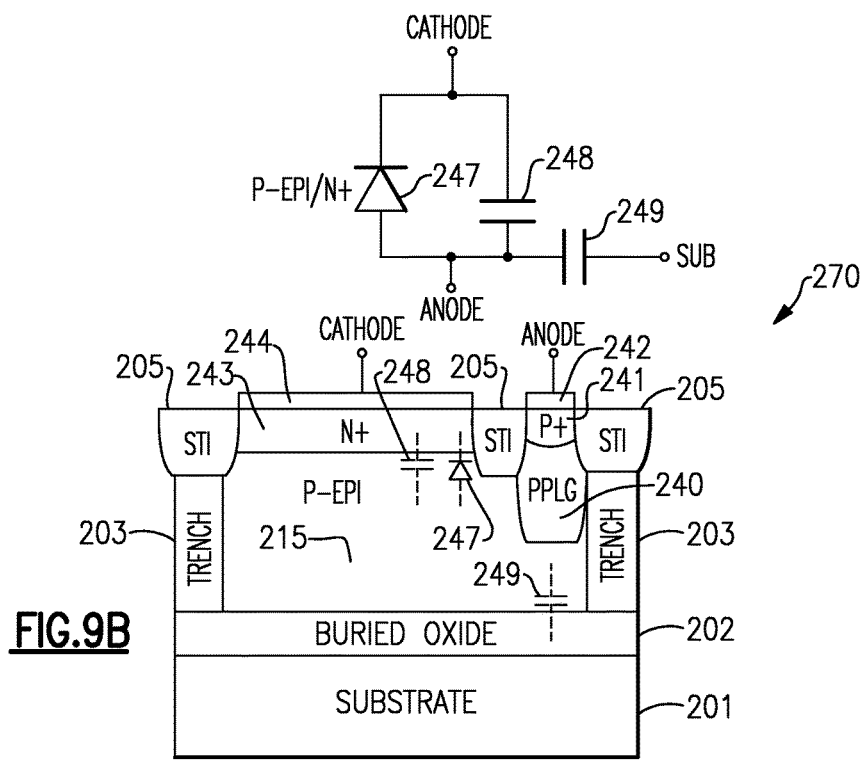
FIG. 9B is an annotated cross-section of a P-EPI/N+ diode device according to another embodiment.

FIG. 9B is an annotated cross-section of a P-EPI/N+ diode device 270 according to another embodiment. The P-EPI/N+ diode device 270 of FIG. 9B is similar to the P-EPI/N+ diode device 230 of FIG. 8B, except that the P-EPI/N+ diode device 270 omits the PBL 214 of FIG. 8B. Omitting the PBL 214 can reduce a capacitance value of the substrate capacitor 248 and increase the device's breakdown voltage.

Additional details of the P-EPI/N+ diode device 270 can be similar to those described earlier.

Figure 10:
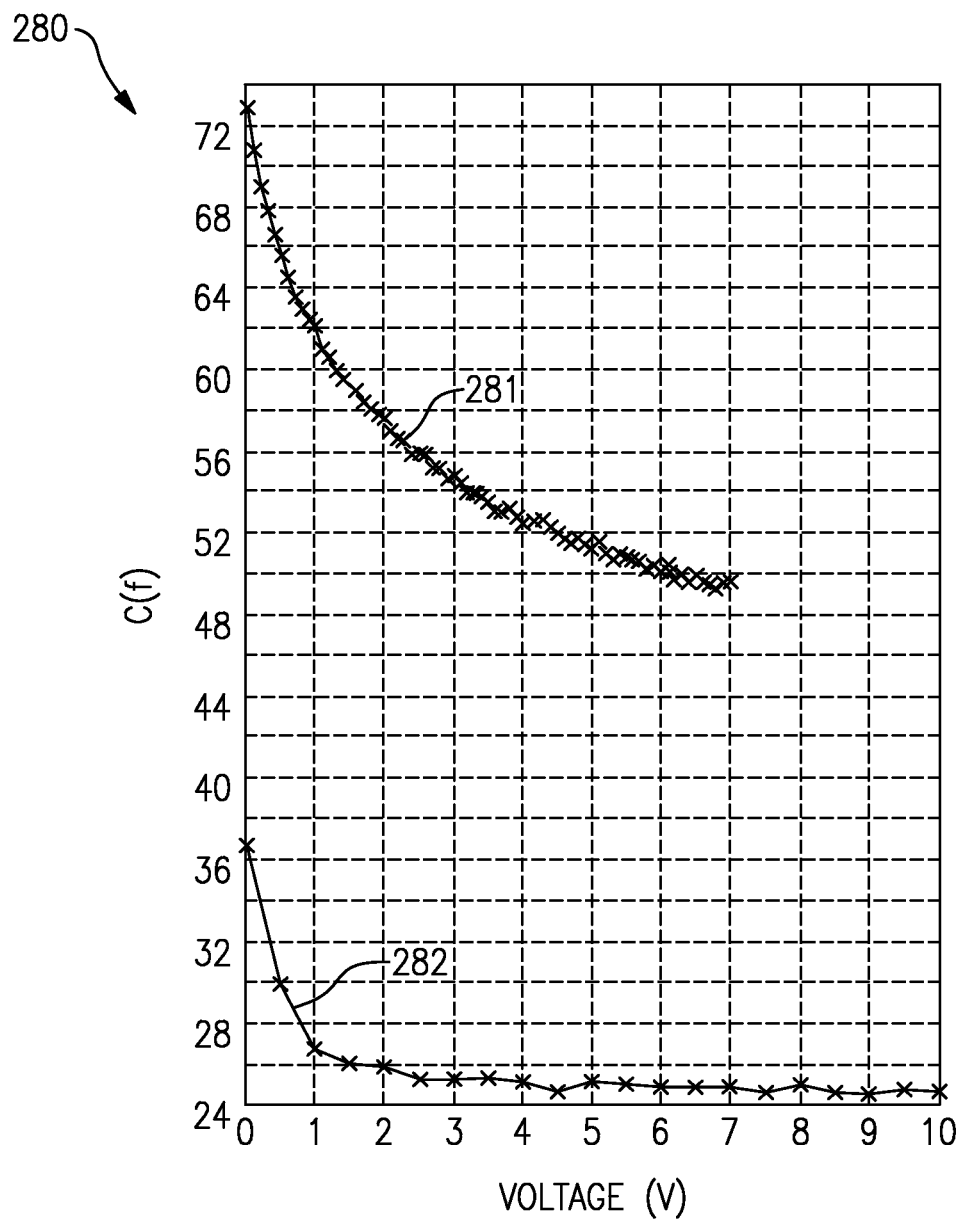
FIG. 10 is a graph of capacitance versus voltage for two examples of ESD diodes.

FIG. 10 is a graph 280 of capacitance versus voltage for two examples of ESD diodes. The graph 280 includes a first plot 281 of simulated capacitance versus voltage for one implementation of the P-EPI/N+ diode device 230 of FIG. 8B. The graph 280 further includes a second plot 282 of simulated capacitance versus voltage for one implementation of the P-EPI/N+ diode device 270 of FIG. 9B.

As shown by a comparison of the first plot 281 to the second plot 282, omitting the PBL 214 reduces the device's parasitic capacitance.

Figure 11:
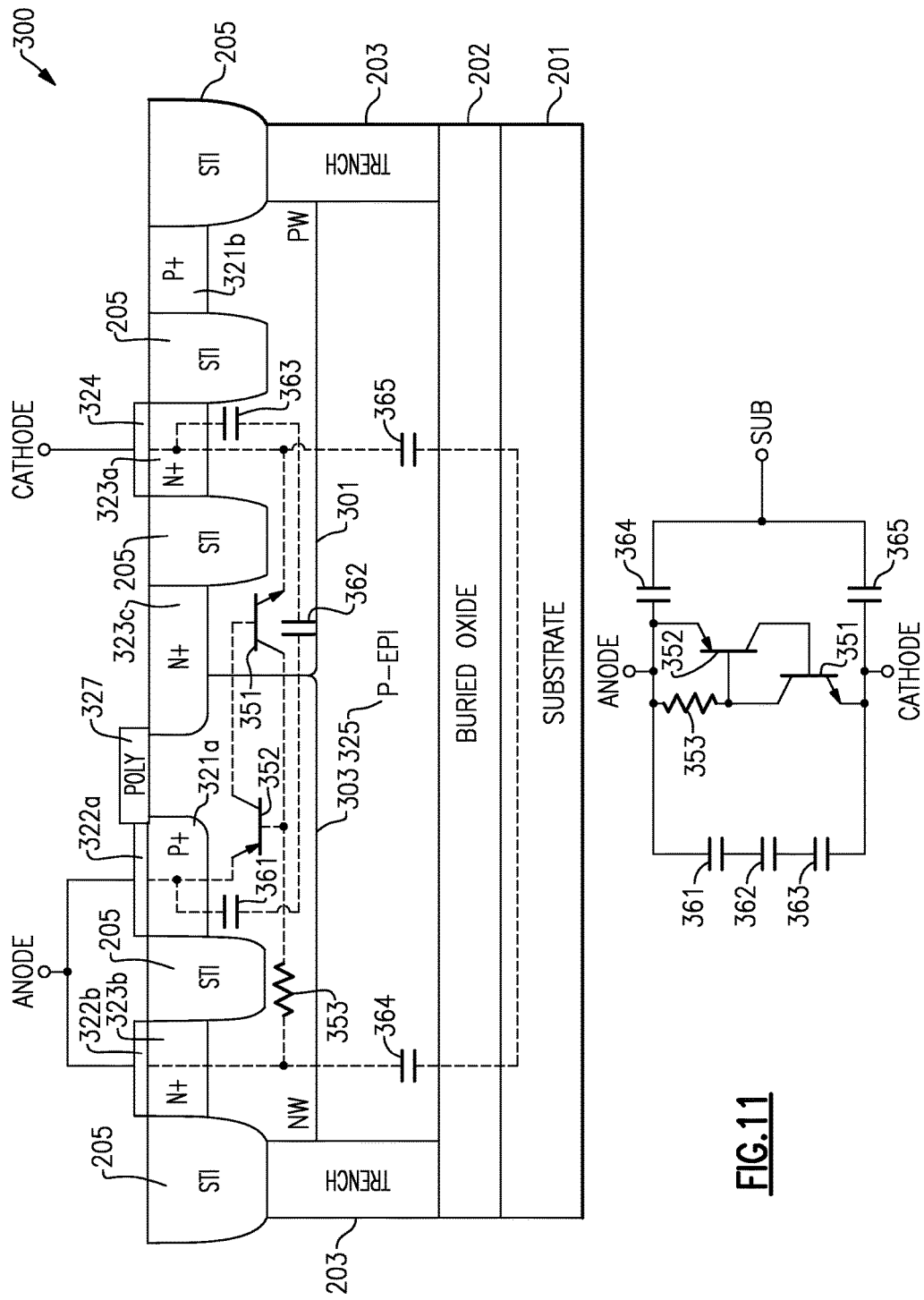
FIG. 11 is an annotated cross-section of a silicon controlled rectifier (SCR) device according to one embodiment.

FIG. 11 is an annotated cross-section of a silicon controlled rectifier (SCR) device 300 according to one embodiment. The SCR device 300 includes a support substrate 201, a buried oxide layer 202, deep trench isolation regions 203, shallow trench isolation regions 205, a P-EPI layer 325, a p-type well (PW) 301, an n-type well (NW) 303, a first P+ region 321a, a second P+ region 321b, a first N+ region 323a, a second N+ region 323b, a third N+ region 323c, a first anode contact 322a, a second anode contact 322b, a cathode contact 324, and a poly gate structure 327. The SCR device 300 further includes an anode terminal (ANODE) and a cathode terminal (CATHODE).

The SCR device 300 has been annotated to show certain circuit components of the device's cross-section, including an NPN bipolar transistor 351, a PNP bipolar transistor 352, a first junction capacitor 361, a second junction capacitor 362, a third junction capacitor 363, an anode substrate capacitor 364, and a cathode substrate capacitor 365. The first junction capacitor 361, the second junction capacitor 362, and the third junction capacitor 363 are electrically connected in series between the anode terminal and the cathode terminal. The anode substrate capacitor 364 is electrically connected between the anode terminal and the substrate, and the cathode substrate capacitor 365 is electrically connected between the cathode terminal and the substrate.

The emitter of the NPN bipolar transistor 351 is electrically connected to the anode terminal, the base of the NPN bipolar transistor 351 is electrically connected to the collector of the PNP bipolar transistor 352, and the collector of the NPN bipolar transistor 351 is electrically connected to the base of the PNP bipolar transistor 352. Additionally, the emitter of the PNP bipolar transistor 352 is electrically connected to the cathode terminal, and the resistor 353 is electrically connected between the base and emitter of the PNP bipolar transistor 352.

The SCR device 300 illustrates one embodiment of the SCR devices of the ESD protection devices of FIGS. 6-7. The ESD protection devices advantageously isolate substrate capacitances of the anode and cathode of the SCR devices by coupling the SCR devices to the radio frequency signal pin RFP using P-EPI/N+ and P+/N-EPI diodes.

The first junction capacitor 361 corresponds to a capacitance of the p-n junction between the first P+ region 321a and the NW 303. Additionally, the second junction capacitor 362 corresponds to a capacitance of the p-n junction between the NW 303 and the PW 301. Furthermore, the third junction capacitor 363 corresponds to a capacitance of the p-n junction between the PW 301 and the first N+ region 323a. The overall junction capacitance of the SCR device 300 corresponds to a series combination of the first junction capacitor 361, the second junction capacitor 362, and the third junction capacitor 363. For a given biasing, the SCR device 300 can include a combination of forward-biased and reverse-biased p-n junctions, and thus includes a mix of diffusion and depletion capacitances. The series combination of forward-biased and reverse-biased junctions can result in smaller variation in overall capacitance versus voltage, thereby providing a higher overall linearity.

The illustrated SCR device 300 is implemented in the P-EPI layer 325, which is electrically floating in this embodiment. Implementing the SCR device 300 in an electrically floating EPI layer can reduce an overall capacitance of the device and/or increase a range of voltage over which the device can operate.

The SCR device 300 includes the poly gate structure 327 positioned between the first P+ region 321a and the third N+ region 323c. The poly gate structure 327 does not operate as a gate of a field effect transistor, since regions of different doping polarities are on opposing sides of the poly gate structure 327. However, the poly gate structure 327 has been advantageously used to operate as an implant blocking region to allow more uniform current conduction and faster response during transient stress conditions. The third N+ region 323c is positioned along a boundary between the NW 303 and the PW 301, and can be used to provide control over the trigger voltage of the SCR device 300 by increasing the concentration of electrons near the interface between the NW 303 and the PW 301.

Figure 12A:
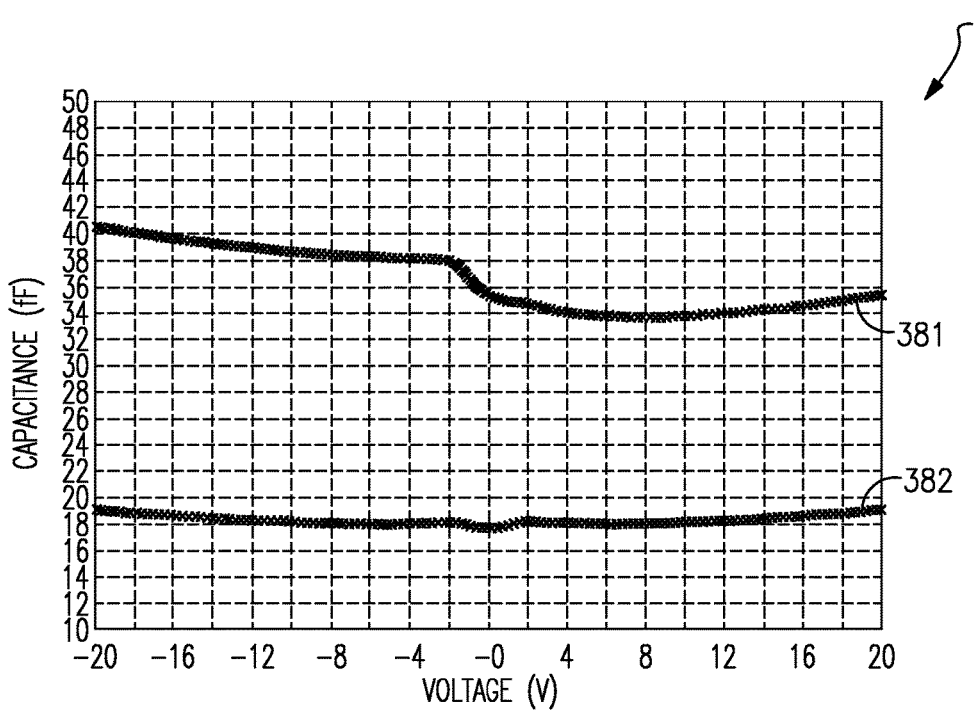
FIG. 12A is a graph of capacitance versus voltage for a connected substrate and for a floating substrate for one example of an ESD protection circuit.

FIG. 12A is a graph 380 of capacitance versus voltage for a connected substrate and for a floating substrate for one example of an ESD protection circuit. The graph 380 includes a first plot 381 of capacitance versus voltage for one implementation of the ESD protection circuit 160 of FIG. 7 with the voltage of the substrate controlled to ground. The graph 380 further includes a second plot 382 of capacitance versus voltage for one implementation of the ESD protection circuit 160 of FIG. 7 with the substrate electrically floating. As shown in FIG. 12A, the ESD protection circuit exhibits lower capacitance when the substrate is floating.

Figure 12B:
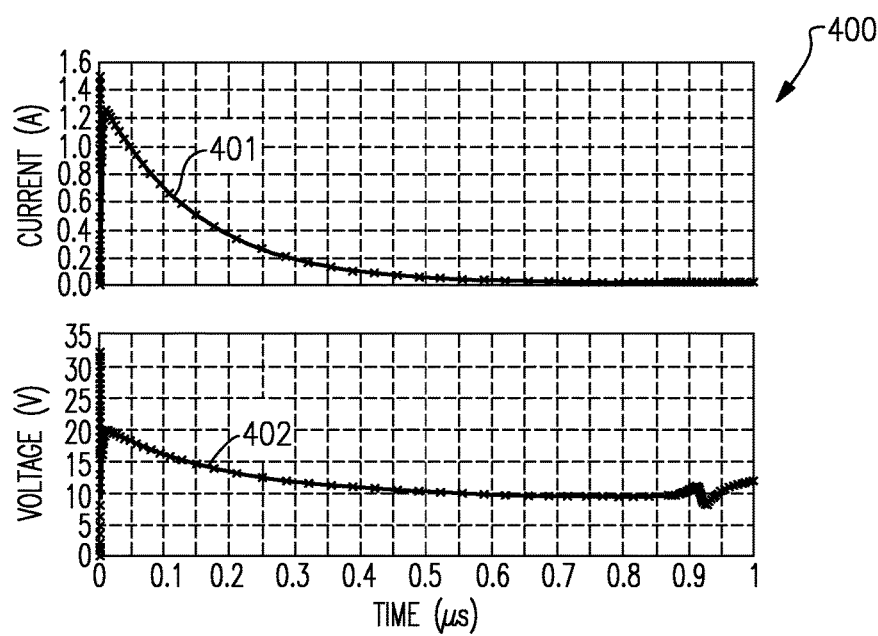
FIG. 12B is a graph of current and voltage versus time for one example of an ESD protection circuit.

FIG. 12B is a graph 400 of current and voltage versus time for one example of an ESD protection circuit. The graph 400 includes a first plot 401 of simulated current versus time and a second plot 402 of simulated voltage versus current for one implementation of the ESD protection circuit 160 of FIG. 7 in response to a human body model (HBM) 2 kV ESD event.

In certain configurations herein, a distributed ESD protection network is electrically connected to a radio frequency signal pin to provide ESD protection. The distributed ESD protection network is implemented using multiple ESD protection circuits that are electrically connecting to one another using inductors. By configuring the distributed ESD protection network in this manner, the capacitance of the distributed ESD protection network can be distributed between inductors and thus isolated from the radio frequency signal pin.

The ESD protection circuit provides protection to a radio frequency circuit that operates with high frequencies beyond those associated with ESD events. For instance, the frequencies of signal components of the ESD event can be associated with frequencies in the range of, for instance, 100 MHz-1 GHz, while the operating frequencies of interest for radio frequency signal pin are much higher.

Inclusion of the inductors has a relatively small impact on the performance of the distributed ESD protection network, since the inductors present relatively low impedance to the ESD event. However, since the signal frequencies are much higher, the inductors present larger impedance to the signal. Thus, at signal frequencies a relatively large proportion of the distributed ESD protection network's capacitance is shielded or isolated from the radio frequency signal pin. Configuring the ESD protection circuit in this manner provides lower overall capacitance, which improves high frequency performance.

The teachings herein can be used to provide a highly linear low capacitance ESD protection circuit for high frequency ports. Although illustrated and described in the context of the protection of radio frequency signal pins, the teachings herein are applicable to signal pins that operate with frequencies beyond radio frequency, including, for example, microwave frequencies.

In certain configurations, the distributed ESD protection network is implemented in combination with low capacitance/high linearity ESD protection circuits, such as those described earlier with respect to FIGS. 1-12B. Thus, the distributed ESD protection network can provide robust ESD protection for bidirectional high frequency signal swings. For instance, the teachings herein can be used to provide a distributed ESD protection network that can operate with highly linear capacitance at voltages of, for instance, up to about +/−10 V. In such configurations, the ESD protection circuit can operate with built-in capacitance linearization. Additionally, inductors can be used to distribute the ESD protection circuit's capacitance in a manner that reduces capacitive loading at the frequencies of interest. Thus, the ESD protection circuit operates as a distributed array of ESD protection circuits that provide robust ESD protection while reducing loading on the signal pin.

Figure 13:
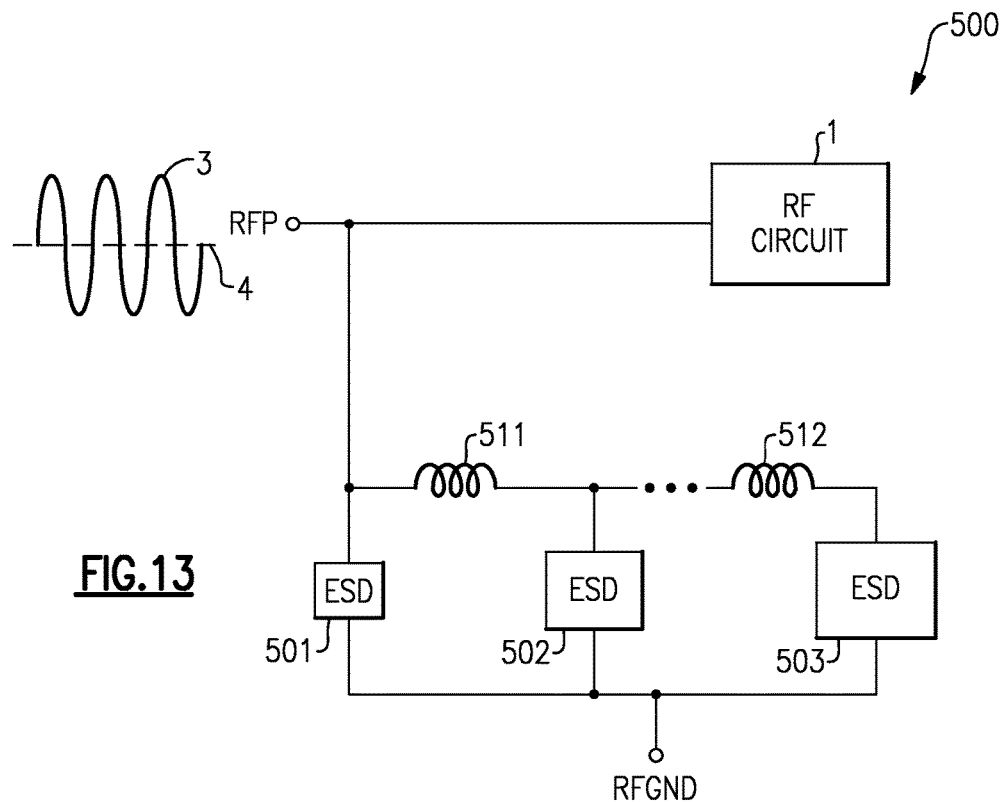
FIG. 13 is a circuit diagram of a radio frequency IC including a distributed ESD protection network according to one embodiment.

FIG. 13 is a circuit diagram of a radio frequency IC 500 including a distributed ESD protection network according to another embodiment. The IC 500 includes a radio frequency signal pin RFP, a radio frequency ground pin RFGND, and a radio frequency circuit 1, which can be as described earlier. The IC 100 further includes a distributed ESD protection network including a first ESD protection circuit 501, a second ESD protection circuit 502, a third ESD protection circuit 503, a first inductor 511, and a second inductor 512.

As shown in FIG. 13, the first ESD protection circuit 501 includes a first terminal electrically connected to the radio frequency signal pin RFP and a second terminal electrically connected to the radio frequency ground pin RFGND. Additionally, the first inductor 511 includes a first end electrically connected to the radio frequency signal pin RFP and a second end electrically connected to a first terminal of the second ESD protection circuit 502. The second ESD protection circuit 502 further includes a second terminal electrically connected to the radio frequency ground pin RFGND. Furthermore, the second inductor 512 includes a first end electrically connected to the first terminal of the second ESD protection circuit 502 and a second end electrically connected to a first terminal of the third ESD protection circuit 503. The third ESD protection circuit 503 further includes a second terminal electrically connected to the radio frequency ground pin RFGND.

Although the IC 500 illustrates a distributed ESD protection network including three ESD protection circuits and two inductors, the IC 500 can be adapted to include more or fewer ESD protection circuits and/or inductors. For example, in one embodiment, an IC includes one inductor and two ESD protection circuits, with the first ESD protection circuit electrically connected between a signal pin and a ground pin and with the second ESD protection circuit electrically connected in series with the inductor between the signal pin and the ground pin. In another embodiment, an IC is implemented in a configuration similar to that of FIG. 13, but the IC includes one or more additional inductors and corresponding ESD protection circuits connected as shown in FIG. 13. Accordingly, a chain of inductors and ESD protection circuits can be provided to achieve a desired ESD protection characteristic.

The first inductor 511 isolates a capacitance of the second ESD protection circuit 502 from the radio frequency signal pin RFP, thereby reducing an impact of the capacitive loading of the ESD protection circuit 502 on operation of the radio frequency circuit 1. Although the first inductor 511 operates as a choke to radio frequency signals received on the radio frequency signal pin RFP, the first inductor 511 is sized to allow passage of signal frequencies associated with an ESD event. For example, an ESD event can be associated with signal frequencies in the range of 100 MHz-1 GHz, while the radio frequency signal pin RFP can receive a signal of a frequency of at least 30 GHz.

In one embodiment, the radio frequency signal 3 received on the radio frequency signal pin RFP is a narrow band signal having a bandwidth in the range of 6-32 GHz. When the frequency band of the radio frequency signal 3 is above that associated with ESD events received on the radio frequency signal pin RFP, the inductors 511, 512 can have a relatively small impact on the operation of the radio frequency circuit 2 coupled to the radio frequency signal pin RFP.

In certain configurations, the ESD protection circuits 501-503 are scaled in size with one another. For example, in one embodiment, the second ESD protection circuit 502 is larger than the first ESD protection circuit 501 and thus has a higher capacitance. In another embodiment, the third ESD protection circuit 503 is larger than the second ESD protection circuit 502 and has a higher capacitance, and the second ESD protection circuit 502 is larger than the first ESD protection circuit 501 and has a higher capacitance.

The inductors 511, 512 can have an inductance selected to provide the desired degree of isolation for the radio frequency signal pin RFP. In one embodiment, the first inductor 511 has an inductance in the range of 0.1 nH to 10 nH and the second inductor 512 has an inductance in the range of 0.1 nH to 10 nH. In certain configurations, one or more inductors can be implemented to offset and tune the capacitance of an ESD protection circuit at pre-defined frequencies. Configuring the ESD protection circuit in this manner can provide robust ESD protection coupled with high radio frequency performance.

Accordingly, in certain configurations, larger ESD protection circuits that provide higher ESD handling capability but have higher capacitance are isolated from the radio frequency signal pin RFP using a greater amount of inductance.

Figure 14:
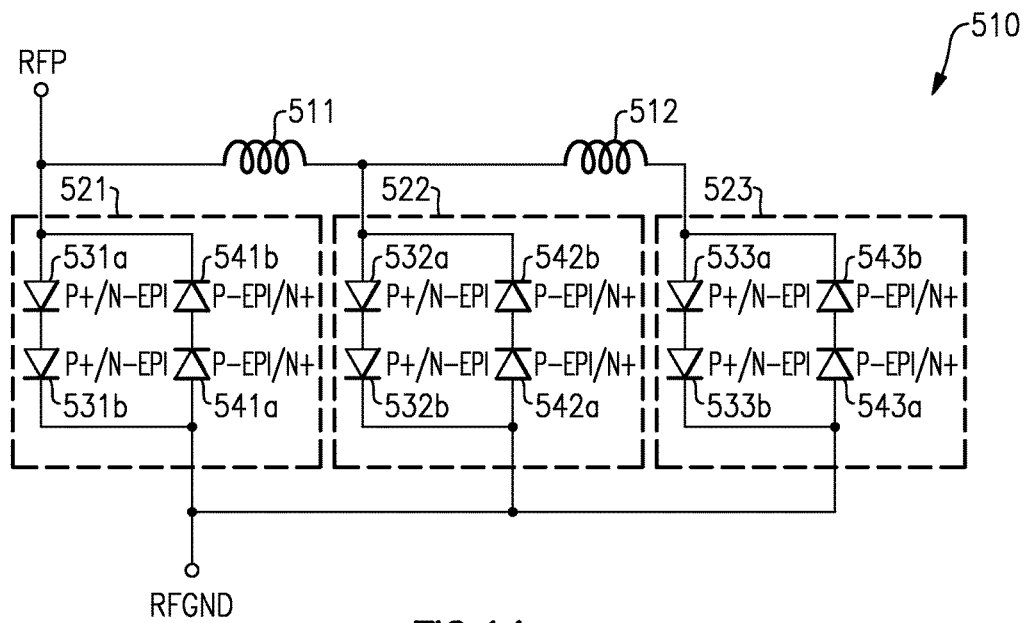
FIG. 14 is a circuit diagram of another embodiment of a distributed ESD protection network for a radio frequency system.

FIG. 14 is a circuit diagram of another embodiment of a distributed ESD protection network 510 for a radio frequency system. The distributed ESD protection network 510 includes a first ESD protection circuit 521, a second ESD protection circuit 522, a third ESD protection circuit 523, a first inductor 511, and a second inductor 512. The distributed ESD protection network 510 of FIG. 14 is similar to the distributed ESD protection network of FIG. 13, except that the distributed ESD protection network 510 includes a specific embodiment of ESD protection circuits implemented using P+/N-EPI and P-EPI/N+ diodes.

In particular, the first ESD protection circuit 521 includes a first pair of series P+/N-EPI diodes 531a, 531b and a first pair of series P-EPI/N+ diodes 541a, 541b electrically connected in parallel. The first pair of series P+/N-EPI diodes 531a, 531b controls the forward protection characteristic of the first ESD protection circuit 521, and the series P-EPI/N+ diodes 541a, 541b controls the reverse protection characteristic of the first ESD protection circuit 521. Similarly, the second ESD protection circuit 522 includes a second pair of series P+/N-EPI diodes 532a, 532b and a second pair of series P-EPI/N+ diodes 542a, 542b electrically connected in parallel. Likewise, the third ESD protection circuit 523 includes a third pair of series P+/N-EPI diodes 533a, 533b and a third pair of series P-EPI/N+ diodes 543a, 543b electrically connected in parallel.

The illustrated P+/N-EPI diodes and P-EPI/N+ diodes can be implemented in a variety of ways, including, for example, using any of the embodiments described earlier with respect to FIGS. 8A-9B.

Although FIG. 14 illustrates an embodiment of the ESD protection circuits 501-503 of FIG. 13 implemented using P+/N-EPI diodes and P-EPI/N+ diodes, the ESD protection circuits 501-503 can be implemented in other ways. For example, the ESD protection circuits 501-503 can be implemented using a variety of ESD protection devices, including, for example, silicon controlled rectifier (SCR) devices, diode devices, bipolar transistor devices, and field-effect transistor devices or a combination thereof. In one embodiment, at least of the ESD protection circuits 501-503 includes a P+/N-EPI diode, such as the P+/N-EPI diode shown in FIG. 8A or 9A. In another embodiment, at least of the ESD protection circuits 501-503 includes a P-EPI/N+ diode, such as the P-EPI/N+ diode shown in FIG. 8B or 9B. In another embodiment, at least of the ESD protection circuits 501-503 includes an SCR device, such as the SCR device 11 of FIG. 11. In another embodiment, at least of the ESD protection circuits 501-503 is implemented using a FET ESD protection circuit, such as the ESD protection circuits of FIGS. 1-3B.

Although FIG. 14 illustrates the ESD protection circuits 521-523 as each including two P+/N-EPI diodes and two P-EPI/N+ diodes, other configurations are possible. For example, the ESD protection circuits 521-523 can include more or fewer P+/N-EPI diodes and/or P-EPI/N+ diodes to achieve the desired protection characteristic.

In certain configurations, the sizes of the diodes of the ESD protection circuits 521-523 are scaled relative to one another. For example, in certain implementations, the diodes of the second ESD protection circuit 522 are greater in size than the diodes of the first ESD protection circuit 521.

Although FIG. 14 illustrates a configuration in which the first, second, and third ESD protection circuits 521-523 are implemented using a similar circuit topology as one another, the first, second, and/or third ESD protection circuits 521-523 can be implemented using different circuit topologies.

Additional details of the distributed ESD protection network 510 can be similar to those described earlier.

Figure 15A:
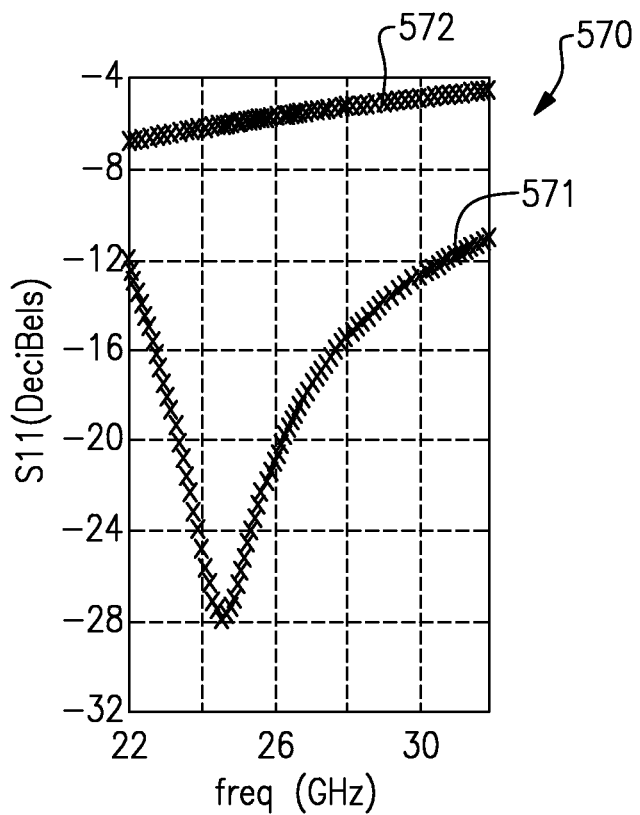
FIG. 15A is a graph of return loss (S11) versus frequency two examples of ESD protection circuits.

FIG. 15A is a graph 570 of return loss (S11) versus frequency two examples of ESD protection circuits. The graph 570 includes a first plot 571 of return loss for one implementation of the distributed ESD protection network 510 of FIG. 14. The graph 570 further includes a second plot 572 of return loss in which the inductors 511, 512 are shorted (omitted).

As shown in FIG. 15A, including the inductors 511, 512 improve return loss.

Figure 15B:
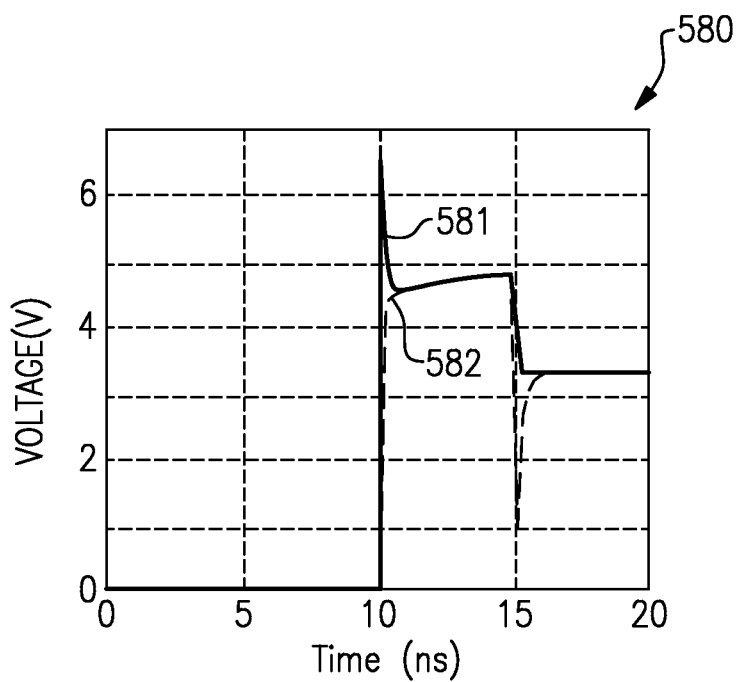
FIG. 15B is a graph of voltage versus time for two examples of ESD protection circuits.

FIG. 15B is a graph 580 of voltage versus time for two examples of ESD protection circuits. The graph 580 includes a first plot 581 of voltage versus time for one implementation of the distributed ESD protection network 510 of FIG. 14 in response to a human body model (HBM) ESD event. The graph 580 further includes a second plot 582 of voltage versus time in which the inductors 511, 512 are shorted (omitted).

As shown in FIG. 15B, the inductors 511, 512 can result in some small voltage peaking or overshoot during an ESD event. However, the ESD clamping otherwise remains substantially unchanged. Thus, inclusion of the inductors results in ESD performance remaining substantially unchanged while radio frequency performance is enhanced by the reduction in capacitive loading of the radio frequency signal pin RFP.

The ESD protection circuits herein can be implemented using a wide variety of manufacturing processes. In certain embodiments, an ESD protection circuit is implemented using a complementary metal oxide semiconductor (CMOS) SOI process. In other embodiments, an ESD protection circuit is implemented using a III-V compound semiconductor BiCMOS process, such as a SiGe BiCMOS process with dimensions of 0.18 μm or smaller. In such configurations, deep oxide trenches and a buried SOI (silicon-on-insulator) substrate can be used to provide isolation. In other embodiments, the ESD protection circuits herein can be implemented using BCD MOS and bulk CMOS technologies.

Applications

Devices employing the above described protection schemes can be implemented into various electronic devices and interface applications, including those operating at radio frequencies and/or microwaves frequencies. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, a mobile phone, a telephone, a television, a computer monitor, a computer, a hand-held computer, a personal digital assistant (PDA), an automobile, a vehicle engine management controller, a transmission controller, a seatbelt controller, an anti-lock brake system controller, a camcorder, a camera, a digital camera, a portable memory chip, etc. Further, the electronic device can include unfinished products.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit comprising:
a first pin and a second pin;
a substrate; and
an electrostatic discharge (ESD) protection circuit over the substrate, wherein the ESD protection circuit comprises:
a forward ESD protection circuit configured to provide protection against a positive polarity ESD event received between the first pin and the second pin, wherein the forward ESD protection circuit comprises a first diode of a first type having an anode electrically connected to the first pin; and
a reverse ESD protection circuit configured to provide protection against a negative polarity ESD event received between the first pin and the second pin, wherein the reverse ESD protection circuit comprises a first diode of a second type having a cathode electrically connected to the first pin,
wherein a capacitance between the substrate and the anode of the first diode of the first type is less than a capacitance between the substrate and a cathode of the first diode of the first type, and wherein a capacitance between the substrate and the cathode of the first diode of the second type is less than a capacitance between the substrate and an anode of the first diode of the second type.

2. The integrated circuit of claim 1, wherein the first diode of the first type comprises a P+/N-EPI diode, and wherein the first diode of the second type comprises a P-EPI/N+ diode.

3. The integrated circuit of claim 2, further comprising:
an insulator layer over the substrate;
an N-EPI layer over the insulator layer; and
a P+ region in the N-EPI layer, wherein the first diode of the first type comprises a p-n junction at an interface between the P+ region and the N-EPI layer.

4. The integrated circuit of claim 3, wherein no n-type buried layer (NBL) is between the N-EPI layer and the insulator layer.

5. The integrated circuit of claim 2, further comprising:
an insulator layer over the substrate;
a P-EPI layer over the insulator layer; and
an N+ region in the P-EPI layer, wherein the first diode of the second type comprises a p-n junction at an interface between the P-EPI layer and the N+ region.

6. The integrated circuit of claim 3, wherein no p-type buried layer (PBL) is between the P-EPI layer and the insulator layer.

7. The integrated circuit of claim 1, wherein the capacitance between the substrate and the anode of the first diode of the first type is less than the capacitance between the substrate and the cathode of the first diode of the first type by at least a factor of 2, and wherein the capacitance between the substrate and the cathode of the first diode of the second type is less than the capacitance between the substrate and the anode of the first diode of the second type by at least a factor of 2.

8. The integrated circuit of claim 1, wherein the forward ESD protection circuit further comprises a first diode of the second type having a cathode electrically connected to the second pin, and wherein the reverse ESD protection circuit further comprises a first diode of the first type having an anode electrically connected to the second pin.

9. The integrated circuit of claim 8,
wherein the forward ESD protection circuit further comprises one or more ESD protection devices electrically connected in series in an electrical path between the cathode of the first diode of the first type and an anode of first diode of the second type,
wherein the reverse ESD protection circuit further comprises one or more ESD protection devices electrically connected in series in an electrical path between the cathode of the first diode of the first type and an anode of first diode of the second type.

10. The integrated circuit of claim 9,
wherein the one or more ESD protection devices of the forward ESD protection circuit comprises at least one silicon controlled rectifier (SCR) device, and wherein the one or more ESD protection devices of the reverse ESD protection circuit comprises at least one SCR device.

11. The integrated circuit of claim 1, wherein the first pin comprises a radio frequency signal pin and the second pin comprises a radio frequency ground pin.

12. The integrated circuit of claim 11, further comprising a radio frequency circuit electrically connected to the radio frequency signal pin.

13. The integrated circuit of claim 11, wherein the radio frequency signal pin is configured to receive a radio frequency signal that swings above and below a voltage of the radio frequency ground pin.

14. The integrated circuit of claim 8, further comprising a radio frequency circuit electrically connected to the radio frequency signal pin.

15. A method of electrostatic discharge (ESD) protection, the method comprising:
protecting a first pin of an integrated circuit from a positive polarity ESD event using a forward ESD protection circuit;
protecting the first pin from a negative polarity ESD event using a reverse ESD protection circuit;
isolating the first pin from a capacitance of the forward ESD protection circuit to a substrate of the integrated circuit using a first diode of a first type, wherein the first diode of the first type has an anode electrically connected to the first pin, and wherein a capacitance between the substrate and the anode of the first diode of the first type is less than a capacitance between the substrate and a cathode of the first diode of the first type; and
isolating the first pin from a capacitance of the reverse ESD protection circuit to the substrate using a first diode of a second type, wherein the first diode of the second type has a cathode electrically connected to the first pin, and wherein a capacitance between the substrate and the cathode of the first diode of the second type is less than a capacitance between the substrate and an anode of the first diode of the second type.

16. The method circuit of claim 15, wherein isolating the first pin from the capacitance of the forward ESD protection circuit to the substrate comprises using a P+/N-EPI diode, and wherein isolating the first pin from the capacitance of the reverse ESD protection circuit to the substrate comprises using a P-EPI/N+ diode.

17. The method circuit of claim 15, wherein protecting the first pin from a positive polarity ESD event comprises activating an electrical path from the first pin to a second pin through the forward ESD protection circuit, wherein the forward ESD protection circuit comprises a series combination of one or more diodes of the first type, one or more ESD protection devices, and one or more diodes of the second type.

18. The method circuit of claim 17, wherein protecting the first pin from a negative polarity ESD event comprises activating an electrical path from the first pin to the second pin through the reverse ESD protection circuit, wherein the reverse ESD protection circuit comprises a series combination of one or more diodes of the first type, one or more ESD protection devices, and one or more diodes of the second type.

19. An integrated circuit comprising:
a first pin;
a second pin;
a forward ESD protection circuit comprising one or more P+/N-EPI diodes, one or more ESD protection devices, and one or more P-EPI/N+ diodes electrically connected in series between the first pin and the second pin, wherein a first P+/N-EPI diode of the one or more P+/N-EPI diodes includes an anode electrically connected to the first pin; and
a reverse ESD protection circuit comprising one or more P+/N-EPI diodes, one or more ESD protection devices, and one or more P-EPI/N+ diodes electrically connected in series between the second pin and the first pin, wherein a first P-EPI/N+ diode of the one or more P-EPI/N+ diodes includes a cathode electrically connected to the first pin.

20. The integrated circuit of claim 19, wherein a first P-EPI/N+ diode of the one or more P-EPI/N+ diodes of the forward ESD protection circuit comprises a cathode electrically connected to the second pin, and wherein a first P+/N-EPI diode of the one or more P+/N-EPI diodes of the reverse ESD protection circuit comprises an anode electrically connected to the second pin.

21. An integrated circuit comprising:
a radio frequency circuit;
a high frequency signal pin coupled to the radio frequency circuit via a signal path;
a ground pin;
a plurality of electrostatic discharge (ESD) protection circuits comprising a first ESD protection circuit and a second ESD protection circuit, wherein the plurality of ESD protection circuits are configured to activate to provide an electrical path between the high frequency signal pin and the ground pin in response to an ESD event; and
one or more inductors configured to isolate the high frequency signal pin from at least a portion of a capacitance of the plurality of ESD protection circuits, wherein the one or more inductors comprises a first inductor electrically connected between the first ESD protection circuit and the second ESD protection circuit, the first inductor having a first terminal coupled to the signal path and a second terminal coupled away from the signal path, and wherein the second ESD protection circuit is isolated from the signal path by way of the first inductor.

22. The integrated circuit of claim 21,
wherein the first ESD protection circuit includes a first terminal and a second terminal, wherein the first terminal is electrically connected to the high frequency signal pin and the second terminal is electrically connected to the ground pin,
wherein the second ESD protection circuit includes a first terminal and a second terminal, wherein the second terminal is electrically connected to the ground pin, and
wherein the first inductor is electrically connected between the first terminal of the first ESD protection circuit and the first terminal of the second ESD protection circuit.

23. The integrated circuit of claim 22, wherein the plurality of ESD protection circuits further comprises a third ESD protection circuit including a first terminal and a second terminal, wherein the second terminal is electrically connected to the ground pin, and wherein the one or more inductors further comprises a second inductor electrically connected between the first terminal of the second ESD protection circuit and the first terminal of the third ESD protection circuit.

24. The integrated circuit of claim 23, wherein a capacitance of the third ESD protection circuit is greater than a capacitance of the second ESD protection circuit, and wherein the capacitance of the second ESD protection circuit is greater than a capacitance of the first ESD protection circuit.

25. The integrated circuit of claim 21, wherein the high frequency signal pin is configured to receive a signal of a frequency of at least 32 GHz.

26. The integrated circuit of claim 21, wherein the high frequency signal pin is configured to receive a narrow band signal having a bandwidth in the range of 6-32 GHz.

27. The integrated circuit of claim 21, wherein the first ESD protection circuit comprises:
one or more P+/N-EPI diodes electrically connected in series between the high frequency signal pin and the ground pin; and
one or more P-EPI/N+ diodes electrically connected in series between the ground pin and the high frequency signal pin.

28. The integrated circuit of claim 21, wherein the one or more P+/N-EPI diodes comprises at least two P+/N-EPI diodes, and wherein the one or more P-EPI/N+ diodes comprises as at least two P-EPI/N+ diodes.

29. An integrated circuit comprising:
a high frequency signal pin;
a ground pin;
a plurality of electrostatic discharge (ESD) protection circuits over a substrate and comprising a first ESD protection circuit and a second ESD protection circuit, wherein the plurality of ESD protection circuits are configured to activate to provide an electrical path between the high frequency signal pin and the ground pin in response to an ESD event, wherein the first ESD protection circuit comprises a forward ESD protection circuit comprising a first diode of a first type having an anode electrically connected to the high frequency signal pin, and a reverse ESD protection circuit comprising a first diode of a second type having a cathode electrically connected to the high frequency signal pin; and one or more inductors configured to isolate the high frequency signal pin from at least a portion of a capacitance of the plurality of ESD protection circuits, wherein the one or more inductors comprises a first inductor electrically connected between the first ESD protection circuit and the second ESD protection circuit, wherein a capacitance between the substrate and the anode of the first diode of the first type is less than a capacitance between the substrate and a cathode of the first diode of the first type, and wherein a capacitance between the substrate and the cathode of the first diode of the second type is less than a capacitance between the substrate and an anode of the first diode of the second type.

30. An electrostatic discharge (ESD) protection network for providing ESD protection between a high frequency signal pin and a ground pin, the ESD protection network comprising:

a high frequency signal path coupled from the high frequency signal pin to a radio frequency circuit;

a first ESD protection circuit including a first terminal electrically connected to the high frequency signal pin and a second terminal electrically connected to the ground pin;

a first inductor including a first end electrically connected to the first terminal of the first ESD protection circuit and also coupled toward the high frequency signal path, and a second end coupled away from the high frequency signal path; and a second ESD protection circuit including a first terminal electrically connected to the second end of the first inductor and a second terminal electrically connected to the ground pin, wherein the first inductor is configured to isolate the high frequency signal path from a capacitance of the second ESD protection circuit.

31. The ESD protection network of claim 29, further comprising:

a second inductor including a first end electrically connected to the first terminal of the second ESD protection circuit and a second end coupled away from the high frequency signal path; and a third ESD protection circuit including a first terminal electrically connected to the second end of the second inductor and a second terminal electrically connected to the ground pin.

32. The ESD protection network of claim 31, wherein a capacitance of the third ESD protection circuit is greater than the capacitance of the second ESD protection circuit, and wherein the capacitance of the second ESD protection circuit is greater than a capacitance of the first ESD protection circuit.

33. The ESD protection network of claim 29, wherein the first ESD protection circuit comprises:

one or more P+/N-EPI diodes electrically connected in series between the high frequency signal pin and the ground pin; and one or more P-EPI/N+ diodes electrically connected in series between the ground pin and the high frequency signal pin.

34. The ESD protection network of claim 33, wherein the one or more P+/N-EPI diodes comprises at least two P+/N-EPI diodes, and wherein the one or more P-EPI/N+ diodes comprises as at least two P-EPI/N+ diodes.

35. The ESD protection network of claim 33, wherein the second ESD protection circuit comprises:

one or more P+/N-EPI diodes electrically connected in series between the second end of the first inductor and the ground pin; and one or more P-EPI/N+ diodes electrically connected in series between the ground pin and the second end of the first inductor.

* * * * *